(12) United States Patent
Rudloff

(10) Patent No.: US 11,782,097 B2
(45) Date of Patent: Oct. 10, 2023

(54) ELECTRICAL SYSTEM TESTING PROCESSES

(71) Applicant: GE Energy Power Conversion Technology Limited, Warwickshire (GB)

(72) Inventor: Olivier Rudloff, Belfort (FR)

(73) Assignee: GE Energy Power Conversion Technology Limited, Warwickshire (GB)

( * ) Notice: Subject to any disclaimer, the term of this patent is extended or adjusted under 35 U.S.C. 154(b) by 0 days.

(21) Appl. No.: 17/551,131

(22) Filed: Dec. 14, 2021

(65) Prior Publication Data

US 2022/0214406 A1 Jul. 7, 2022

(30) Foreign Application Priority Data

Jan. 4, 2021 (EP) .................................. 21150119

(51) Int. Cl.
| | | |
|---|---|---|
| *G01R 31/42* | (2006.01) | |
| *G01R 31/34* | (2020.01) | |
| *H02M 1/36* | (2007.01) | |
| *H02M 7/5387* | (2007.01) | |
| *H02M 1/32* | (2007.01) | |

(52) U.S. Cl.
CPC .......... *G01R 31/42* (2013.01); *G01R 31/343* (2013.01); *H02M 1/36* (2013.01); *H02M 7/53871* (2013.01); *H02M 1/32* (2013.01)

(58) Field of Classification Search
CPC ......... G01R 31/52; G01R 31/42; G01R 31/00
See application file for complete search history.

(56) References Cited

U.S. PATENT DOCUMENTS

| | | |
|---|---|---|
| 5,363,039 A | 11/1994 | Kumar |
| 6,078,173 A | 6/2000 | Kumar |
| 7,486,099 B1 | 2/2009 | Manika |
| 8,781,764 B2 | 7/2014 | Singh |
| 8,810,189 B2 | 8/2014 | Singh |
| 9,063,202 B2 | 6/2015 | Hendrickson |
| 9,121,913 B2 | 9/2015 | Singh |
| 9,239,364 B2 | 1/2016 | Sebald |
| 9,448,271 B2 | 9/2016 | Yan |
| 9,654,048 B2 | 5/2017 | West |
| 10,090,777 B2 | 10/2018 | Dent |
| 10,816,601 B2 | 10/2020 | Yang |
| 10,971,993 B2 | 4/2021 | Yang |
| 2017/0302189 A1* | 10/2017 | Jakob .................... H02M 1/088 |

(Continued)

OTHER PUBLICATIONS

European Search Report from EP Appl. No. 21150119.2, dated Jul. 14, 2021.

*Primary Examiner* — Jermele M Hollington
*Assistant Examiner* — Temilade S Rhodes-Vivour
(74) *Attorney, Agent, or Firm* — WOOD IP LLC

(57) ABSTRACT

A testing process for an electrical system is described. The electrical system includes a power converter and a direct current (DC) bus with two or more DC bus terminals and at least one DC bus capacitor. The testing process is a fully automated testing process where a sequence of different diagnostic tests are carried out on the electrical system, each diagnostic test testing one of the power converter and the DC bus to determine if it is responding as expected or operating within normal parameters.

16 Claims, 6 Drawing Sheets

(56) References Cited

U.S. PATENT DOCUMENTS

| | | | |
|---|---|---|---|
| 2018/0026550 A1* | 1/2018 | Dent | H02J 7/0068 |
| | | | 363/55 |
| 2018/0166910 A1* | 6/2018 | Sun | H02J 7/00 |
| 2019/0067932 A1* | 2/2019 | Li | H02M 7/2173 |
| 2021/0325478 A1* | 10/2021 | Hu | G01R 31/42 |

* cited by examiner

ELECTRICAL SYSTEM TESTING PROCESSES

TECHNICAL FIELD

The present invention relates to a testing process for an electrical system that includes a power converter, and in particular to a testing process that does not require the use of any additional testing equipment or components.

In general terms, the testing process comprises a sequence of different diagnostic tests that are designed to test the different components of the electrical system. Each diagnostic test can be performed as a series of individual steps. The data obtained during each diagnostic test can be used to check that the electrical system is responding as expected. Data can also be recorded or stored so that it can be compared against data obtained during a future testing process to check for component failure or aging, for example.

BACKGROUND

Electrical system testing processes are known. But such known testing processes are typically carried out manually (e.g., by an engineer) and take a long time to complete— sometimes several days. The testing processes also require the use of additional testing equipment or components to obtain the necessary data.

Consequently, there is a need for an improved testing process that can be carried out more rapidly and using only those components of the electrical system that will be used during the normal operation of the electrical system.

SUMMARY

The present invention provides an electrical system comprising:
- a power converter including:
  - two or more direct current (DC) converter terminals, and at least one converter leg connected to the DC converter terminals, each converter leg including a plurality of semiconductor switches and an alternating current (AC) terminal that defines an AC phase of the electrical system and is connectable to a respective AC terminal of an electrical load;
- a DC bus including:
  - two or more DC bus terminals, each DC bus terminal being connected to a respective DC converter terminal, and
  - at least one DC bus capacitor;
- a DC voltage supply for supplying a DC voltage to the DC bus;
- a control unit adapted to control the DC voltage supply and the plurality of semiconductor switches to put the converter leg in an off-state, or in one of a plurality of on-states that defines a respective voltage level of the converter leg;
- at least one voltage sensor connected to the control unit for measuring a DC bus voltage; and
- at least one current sensor connected to the control unit for measuring an AC current in least one AC phase of the electrical system;

wherein the control unit is further adapted to carry out a testing process as described below. The testing process is preferably a fully automated testing process (or "auto-testing process") where a sequence of different diagnostic tests are carried out on the electrical system without any further manual involvement. Each diagnostic test is designed to test a different component of the electrical system (e.g., the power converter, DC bus, sensors etc.) to determine if it is responding as expected or operating within normal parameters.

The testing process can be carried out without the need for any additional testing equipment or components. Only the components that are used during the normal operation of the electrical system are used. This includes the sensors that provide voltage and current measurements to the control unit. Where necessary, the electrical system is controlled to create the necessary electrical conditions for the diagnostic tests to be carried out.

Power Converter:

The power converter has two or more DC converter terminals. In one arrangement, the power converter includes a positive DC converter terminal, a negative DC converter terminal, and optionally one or more intermediate DC converter terminals. For example, if the power converter has three voltage levels, the power converter will normally include one intermediate (or midpoint) DC converter terminal. If the power converter has five voltage levels, the power converter will normally include three intermediate DC converter terminals, and so on.

The power converter has at least one converter leg connected to the DC converter terminals. Each converter leg includes a plurality of semiconductor switches (e.g., IGBTs) that can be arranged in any suitable topology, e.g., two-level, multi-level neutral point piloted (NPP) or neutral point clamped (NPC) etc. as will be known to the skilled person. Each converter leg includes an AC terminal that defines an AC phase of the electrical system.

In practice, the power converter can have any suitable number of converter legs, but three converter legs would be typical. In this arrangement, the power converter will have three AC terminals and hence three AC phases. The converter legs are normally connected to the DC converter terminals in parallel.

Each AC terminal is connectable to a respective AC terminal of the electrical load. The electrical load can be an electric motor, for example.

The AC terminal(s) of the power converter can be connected to the electrical load by a suitable switching device. If the switching device is open, the power converter is electrically isolated from the electrical load. The switching device is normally closed during majority of the testing process so that the power converter is electrically connected to the electrical load.

DC Bus:

The DC bus has two or more DC bus terminals, each DC bus terminal being connected to a respective DC converter terminal. In one arrangement, the DC bus includes a positive DC bus terminal that is connected to the positive DC converter terminal, and a negative DC bus terminal that is connected to the negative DC converter terminal. The positive DC bus terminal can define a positive voltage level and the negative DC bus terminal can define a negative voltage level. The DC bus can optionally include one or more intermediate DC bus terminals. For example, if the power converter has three voltage levels, the DC bus will normally include one intermediate (or midpoint) DC bus terminal that is connected to the intermediate (or midpoint) DC converter terminal and can define a midpoint (or zero) voltage level of the power converter. The voltage levels can be conveniently identified as +1, 0 and −1. If the power converter has five voltage levels, the DC bus will normally include three intermediate DC bus terminals that respectively define a second positive voltage level, a midpoint (or zero) voltage level, and a second negative voltage level of the power converter, and so on. The voltage levels can be conveniently identified as +2, +1, 0, −1 and −2.

The DC bus includes at least one DC bus capacitor. The DC bus can include two or more DC bus capacitors connected in series. For example, if the DC bus includes a positive DC bus terminal, a negative DC bus terminal, and an intermediate (or midpoint) DC bus terminal, the DC bus can include a first DC bus capacitor connected between the positive and intermediate DC bus terminals, and a second DC bus capacitor connected between the intermediate and negative DC bus terminals. In general terms, if the power converter has n voltage levels, where n=2, 3, 5 etc., the DC bus will have n DC bus terminals and (n−1) DC bus capacitors, each DC bus capacitor being connected between an adjacent pair of DC bus terminals and defining a respective partial DC bus voltage.

The partial DC bus voltage across each of the DC bus capacitors can be measured independently by a respective voltage sensor.

Unless otherwise stated, any reference herein to a "DC bus voltage" can be taken to be any appropriate DC bus voltage. In particular, in an arrangement where the DC bus includes two or more DC bus capacitors, the referenced DC bus voltage can be the partial DC bus voltage across one or more of the DC bus capacitors, or the total DC bus voltage across the DC bus as a whole (i.e., across all of the series-connected DC bus capacitors). For example, if the DC bus includes two DC bus capacitors, the "DC bus voltage" can be:
  the partial DC bus voltage across the DC bus capacitor connected between the positive DC bus terminal and the intermediate (or midpoint) DC bus terminal, or
  the partial DC bus voltage across the DC bus capacitor connected between the intermediate (or midpoint) DC bus terminal and the negative DC bus terminal, or
  the total DC bus voltage across both of the DC bus capacitors, i.e., the DC voltage between the positive and negative DC bus terminals.

DC Voltage Supply:

The DC voltage can be supplied to the DC bus from any suitable DC voltage supply.

In one arrangement, the DC voltage can be supplied using a pre-charge circuit. A pre-charge circuit is typically used as a low-voltage power supply to charge the DC bus capacitors before the power converter is enabled for normal operation—e.g., where the power converter is operated as an inverter to supply power from the DC bus to the electrical load or as an active rectifier to supply power from the electrical load to the DC bus. The pre-charge circuit is therefore a normal part of the electrical system and can be used for the testing process.

The pre-charge circuit can be connected directly to the DC bus. In this arrangement, the pre-charge circuit can also be connected to an AC power supply and includes a pre-charge rectifier. The DC voltage supply can be considered to be the AC power supply and the pre-charge circuit, including the pre-charge rectifier. The AC power supply can be a supply network or utility grid, for example.

The DC bus can be connected to a second power converter. The second power converter can have two or more DC converter terminals that are connected respectively to the DC bus terminals, and at least one AC terminal that is connected to an AC power supply. The AC power supply can be a supply network or utility grid, for example. During normal operation of the electrical system, the second power converter can be operated as a rectifier to supply power from the AC power supply to the DC bus. The second power converter can be a diode bridge or an active rectifier, for example. If the second power converter is capable of being operated as an inverter, it can supply power from the DC bus to the AC power supply. The pre-charge circuit can be connected to the AC-side of the second power converter (e.g., to the AC-side of the diode bridge). The DC voltage supply can be considered to be the AC power supply, the pre-charge circuit and the second power converter. In other words, the DC voltage is supplied to the DC bus through the second power converter which forms part of the electrical system.

The pre-charge circuit can include a contactor that can be opened and closed by the control unit. In particular, the control unit can generate open and close commands to operate the contactor. The pre-charge circuit will only supply a DC voltage to the DC bus when the pre-charge contactor is closed.

Control Unit:

Any suitable electronic control unit can be used. The control unit can comprise a plurality of coordinated control units or controllers where each control unit is adapted for specific control functions, e.g., for controlling the switching operation of the semiconductor switches of the power converter by generating gate drive commands, opening and closing a particular contactor by generating open and close commands, receiving and storing sensor measurements, data processing, generating fault signals etc.

The control unit will receive data (e.g., measurements from the voltage and current sensors and other relevant measurements or information) and process the data to generate fault signals. The data does not have to be processed in "real time". For some diagnostic tests, it can be preferable to record or store the data and then carry out data processing on the recorded or stored data at a later time, in a separate step, including during the testing process (e.g., between sequential diagnostic tests). Data derived as part of the data processing by the control unit can also be recorded or stored and used to generate fault signals. Data can also be transmitted for remote analysis and diagnostics.

Data derived from testing processes carried out a different times can be compared and analysed to determine if any components of the electrical system are responding differently as a result of ageing or internal faults, for example. For example, each testing process can derive an "individual signature" for the electrical system with data that includes certain measured or determined values. Measured or determined values obtained during the testing process can include one or more of:
  the response time for closing the switching device between the AC terminal(s) of the power converter and the electrical load,
  the response time for closing the cooling system contactor,
  the response time for closing the pre-charge contactor,
  the response time for opening and/or closing the switching device,
  DC bus charging time-constant,
  DC bus internal time-constant,
  partial DC bus voltage imbalance,
  DC bus discharging time-constant, for example.

The data obtained during the testing process can include measured or determined values that vary as a function of time including one or more of:

a DC voltage profile
an AC current profile, and
an AC voltage profile, for example.

A first testing process can be carried out (e.g., when the electrical system is commissioned) to determine a baseline individual signature, and this baseline individual signature can be compared with individual signatures obtained by carrying out the same testing process on the electrical system in the future (e.g., during regular scheduled maintenance or following a repair). It is also possible to compare individual signatures obtained from subsequent testing processes—i.e., testing processes carried out after the first testing process. In one example, the response time for closing the pre-charge contactor obtained during a testing process can be compared with the corresponding response time obtained during a previous testing process. Taking into account any appropriate tolerance value to allow for measurement error etc., if there is a difference between the two response times, this can indicate ageing or a fault in the pre-charge contactor. In another example, a DC voltage profile obtained during a testing process can be compared with the corresponding DC voltage profile obtained during a previous testing process. If there is a difference between the two profiles, this can indicate aging or a fault in the DC bus, for example. It will be readily understood that these examples are intended simply to illustrate the sort of comparison that can be made and that, in practice, the same sort of comparison between data obtained from two or more testing processes carried out a different times can be carried out on any of the data obtained.

The individual signature obtained during each testing process can be recorded or stored and can also be made available for remote analysis and diagnostics. The data derived from each testing process can be analysed using any suitable mathematical or computational methods as will be known to the skilled person for the general purposes outlined herein.

Each diagnostic test can be carried out in turn and the testing process can be ended prematurely if a fault signal is generated. In another arrangement, the complete testing process can be carried out even if one or more fault signals are generated, except where the fault signal indicates that the power converter or other component of the electrical system might be damaged, for example. The fault signals can then be analysed at the completion of the testing process.

The control unit can control the switching operation of the plurality of semiconductor switches of the power converter (i.e., transition each switch between an on-state and an off-state) by generating gate drive commands for the respective gate drivers. The gate drive commands can be generated using a pulse width modulation (PWM) control strategy that uses a modulation index and a carrier waveform (e.g., a triangular or sawtooth waveform). During the testing process, the modulation index can be selected to produce an expected AC current in the one of more AC phases of the electrical system.

Each converter leg can be put in an off-state by the control unit. As used herein, the "off-state" of the converter leg refers to a switching state where the power converter is enabled but where all of the semiconductor switches in the converter leg are in the off-state (i.e., turned off).

Each converter leg can be put in one of a plurality of on-states by the control unit. As used herein, an "on-state" of the converter leg refers to a switching state where the semiconductor switches in the converter leg are in an on- or off-state (i.e., either turned on or off) to define a respective voltage level in the AC phase. It can be readily understood that each on-state of the converter leg is determined by the individual switching states of the semiconductor switches. In one arrangement, where the power converter has three voltage levels, and is being operated as an inverter, a first on-state will define a positive voltage level (or +1) in the AC phase, a second on-state will define a negative voltage level (or −1) in the AC phase, and a third on-state will define a zero voltage level (or 0) in the AC phase, for example. During normal operation of the power converter as an inverter, for example, each converter leg will be transitioned independently between the various on-states by the control unit according to a suitable control scheme (e.g., the PWM control scheme mentioned above) to generate a desired AC output voltage to be supplied to the electrical load. During the testing process, the converter legs can be put in the "off-state" or in one of the "on-states" (the first diagnostic tests) or operated using a suitable control scheme (the second and third diagnostic tests) as described in more detail below. In the other diagnostic tests described below, the converter legs are typically put in the "off-state" and the power converter is not enabled.

The control unit can control the operation of one or more contactors (e.g., the contactor in the pre-charge circuit or the cooling system) by generating respective open and close commands. The control unit can be connected to each contactor by any suitable wired connection or wireless connection as appropriate. The control unit can control the operation of the switching device by generating respective open and close commands. The control unit can be connected to the switching device by any suitable wired connection or wireless connection as appropriate.

The control unit can control operation of an optional chopper circuit—see below.

Sensors:

Any suitable voltage and current sensors can be used. The voltage and current sensors are connected to the control unit and provide voltage and current measurements, respectively, for use in the diagnostic tests. The connection can be wired connection or a wireless connection as appropriate with measurements being transmitted to the control unit using any suitable protocol.

The electrical system can further include at least one voltage sensor connected to the control unit for measuring one or more AC voltages of the electrical system, e.g., the AC voltage in at least one AC phase (phase voltage) or between at least two AC phases (line voltage).

Chopper Circuit:

The electrical system can optionally include a chopper circuit connected in parallel with the DC bus, the chopper circuit including at least one semiconductor switch connected in series with a resistor for dissipating excess electrical energy in the DC bus as heat.

Each semiconductor switch (e.g., IGBT) of the chopper circuit can be controlled by the control unit so that the chopper circuit short-circuits and discharges each DC bus capacitor in a manner known to the skilled person. In particular, each semiconductor switch can be controlled by the control unit to be switched between an on-state and an off-state according to a suitable control strategy. Gate drive commands for each semiconductor switch can be generated using a PWM control strategy that uses a modulation index and a carrier waveform (e.g., a triangular or sawtooth waveform). During normal operation of the chopper circuit, the modulation index can switch each semiconductor switch between the on-state and off-state to create an intermittent short-circuit path between one or more pairs of DC bus terminals. The short-circuit path includes the resistor. The chopper circuit dissipates the excess electrical energy in a safe manner which prevents overheating. The chopper circuit can also be operated to discharge the DC bus capacitors with the stored energy being dissipated in the resistor. During the testing process, the modulation index can be selected to produce an expected DC voltage after a period of time when discharging the DC bus, or to discharge the DC bus as rapidly as possible, e.g., by creating a continuous short-circuit path between the one or more pairs of DC bus terminals.

Testing Process:

The present invention provides a testing process for an electrical system, the electrical system comprising:

a power converter including:
two or more DC converter terminals, and at least one converter leg connected to the DC converter terminals, each converter leg including a plurality of semiconductor switches and an AC terminal that defines an AC phase of the electrical system and is connectable to a respective AC terminal of an electrical load,
wherein the plurality of semiconductor switches are controllable to put the converter leg in an off-state, or in one of a plurality of on-states that defines a respective voltage level of the converter leg; and
a DC bus including:
two or more DC bus terminals, each DC bus terminal being connected to a respective DC converter terminal, and
at least one DC bus capacitor;
the testing process being a fully automated testing process where a sequence of different diagnostic tests are carried out on the electrical system, each diagnostic test testing one of the power converter and the DC bus to determine if it is responding as expected or operating within normal parameters.

The testing process preferably comprises:
one or more first diagnostic tests where each converter leg is in the off-state, or in the same one of the plurality of on-states, each first diagnostic test comprising:
measuring a DC bus voltage while a DC voltage is supplied to the DC bus for a period of time, and generating a fault signal if the measured DC bus voltage does not exceed a first expected DC bus voltage.

The testing process preferably further comprises:
a second diagnostic test comprising the steps of:
measuring a DC bus voltage while a DC voltage is supplied to the DC bus, ending the supply of the DC voltage when the measured DC bus voltage exceeds a first DC bus voltage, and allowing the DC bus voltage to decrease gradually towards the first DC bus voltage,
when the measured DC bus voltage is substantially equal to the first DC bus voltage, controlling the power converter to provide an expected AC current in at least one AC phase of the electrical system,
measuring the AC current in the at least one AC phase of the electrical system, and
generating a fault signal if the measured AC current is not within a range defined by the corresponding expected AC current plus or minus a tolerance value.

Zeroth Diagnostic Test:

Preparatory to the first diagnostic test being carried out, the switching device can be closed to connect the power converter to the electrical load, and any cooling system can be turned on so that the electrical system is properly cooled while the testing process is carried out. The response time of the switching device can be checked as a zeroth diagnostic test (i.e., a diagnostic test that is carried out before the first diagnostic test). In particular, it is possible to measure the time between the close signal being initiated by the control unit and a feedback signal confirming that the switching device has closed being received. A fault signal is generated if the measured time is greater than an expected response time. The response time for the switching device closing can be recorded or stored. If the cooling system includes one or more contactors (e.g., for switching on pumps or similar components) that are controlled by the control unit, the response time of each contactor can also be checked during the zeroth diagnostic test. In particular, it is possible to measure the time between the close signal being initiated by the control unit and a feedback signal confirming that the contactor has closed being received. A fault signal is generated if the measured time is greater than an expected response time. The response time of the cooling system contactor closing can be recorded or stored.

The zeroth diagnostic test corresponds generally to Step 1 of the example testing process described below.

First Diagnostic Tests:

The purpose of the first diagnostic tests is to check that the DC bus is responding as expected.

The first diagnostic tests correspond generally to Steps 2-5 of the example testing process described below.

During each first diagnostic test, each converter leg of the power converter is controlled to be in the off-state, or in the same one of the plurality of on-states. For example, if the power converter includes three converter legs, all three converter legs are controlled to be the same state, namely the off-state or the same on-state.

Preferably, a plurality of first diagnostic tests are carried out sequentially with the converter legs in a different state for each first diagnostic test. For example, if each converter leg of the power converter can be put into three on-states, where each on-state defines a positive, negative and zero voltage level in the AC phase, a first diagnostic test can be carried out with each converter leg in the off-state, another first diagnostic test can be carried out with each converter leg in a first on-state, another first diagnostic test can be carried out with each converter leg in a second on-state, and another first diagnostic test can be carried out with each converter leg in a third on-state. There is no fixed sequence for the different states, and it is possible for the control unit to put each converter leg in some or all of the available states in any suitable sequence or order.

During each first diagnostic test, a DC voltage is supplied to the DC bus for a period of time to increase the DC bus voltage. As explained above, the DC bus voltage can be the partial DC bus voltage across one or more of the DC bus capacitors, or the total DC bus voltage across the DC bus as a whole (i.e., across all of the series-connected DC bus capacitors).

The period of time for which the DC voltage is supplied to the DC bus can be about 100-200 ms, for example. The period of time should be long enough to allow the DC bus voltage to reach the expected DC bus voltage if the DC bus is operating normally.

The DC voltage can be supplied by closing the contactor in the pre-charge circuit for the period of time. The response time of the pre-charge contactor can be checked during at least one of the first diagnostic tests. In particular, it is possible to measure the time between the close signal being initiated by the control unit and a feedback signal confirming that the contactor has closed being received. A fault signal is generated if the measured time is greater than an expected response time. The response time of the pre-charge contactor can be recorded or stored.

A fault signal is generated if a measured DC bus voltage has not exceeded an expected DC bus voltage during a period of time (which can be the same as, or shorter than, the period of time for which the DC voltage is supplied to the DC bus). As explained above, the measured DC bus voltage can be the partial DC bus voltage across one or more of the DC bus capacitors, or the total voltage across the DC bus as a whole (i.e., across all of the series-connected DC bus capacitors). In one arrangement, the expected DC bus voltage can be based on a measurement of the DC bus voltage at the start of each first diagnostic test (an "initial DC bus voltage"). For example, a fault signal can be generated if the measured DC bus voltage does not increase by a certain percentage, e.g., by at least about 2-3%, relative to the initial DC bus voltage, within a period of time, e.g., about 15-25 ms. In another arrangement, the expected DC bus voltage can be a threshold, which can optionally be determined with reference to the rated DC voltage. For example, a fault signal can be generated if the measured DC bus voltage does not exceed a certain percentage of the rated DC voltage within a period of time. These parameters can be selected with reference to the level of stored energy in the DC bus.

A fault signal can be generated if the AC output current of the power converter exceeds a threshold, e.g., about 2% of the rated converter current, during each first diagnostic test.

After the contactor in the pre-charge circuit is opened at the end of each first diagnostic test, the DC bus voltage will decrease gradually. The testing process can transition to another first diagnostic test where the converter legs are in a different state, or to the second diagnostic test, when a meas ured DC bus voltage has fallen below a threshold, which can optionally be determined with reference to the rated DC voltage. For example, the testing process can transition to another first diagnostic test, or to the second diagnostic test, when a measured DC bus voltage has fallen below a certain percentage of the rated DC voltage, e.g., below about 1.5-2.5% of the rated DC voltage.

Second Diagnostic Test:

The purpose of the second diagnostic test is to check that the power converter and the sensors are responding as expected.

The second diagnostic test corresponds generally to Steps 6-13 of the example testing process described below.

On transition to the second diagnostic test, the DC bus voltage can be below a threshold, which can optionally be determined with reference to the rated DC voltage. For example, the DC bus voltage can be below a certain percentage of the rated DC voltage, e.g., below about 1.5-2.5% of the rated DC voltage.

At the start of the second diagnostic test, a DC voltage is supplied to the DC bus to increase the DC bus voltage.

The DC voltage can be supplied by closing the contactor in the pre-charge circuit.

In the second diagnostic test, the DC voltage is not supplied to the DC bus for a fixed period of time. Instead, the DC voltage is supplied until a measured DC bus voltage exceeds a first DC bus voltage. The first DC bus voltage can be a threshold which can optionally be determined with reference to the rated DC voltage. For example, the first DC bus voltage can be about 5-15% of the rated DC voltage. The first DC bus voltage should be high enough to allow proper switching operation of the semiconductor switches, but low enough that the power converter will not be damaged in the case of a failure in one or more of the semiconductor switches during the second diagnostic test.

A fault signal is generated if a measured DC bus voltage has not exceeded an expected DC bus voltage during a period of time. In one arrangement, the expected DC bus voltage can be based on a measurement of the DC bus voltage at the start of the second diagnostic test when the pre-charge contactor is closed (an "initial DC bus voltage"). For example, a fault signal can be generated if the measured DC bus voltage does not increase by a certain percentage, e.g., by at least about 2-3%, relative to the initial DC bus voltage, within a period of time, e.g., about 15-25 ms. In another arrangement, the expected DC bus voltage can be a threshold, which can optionally be determined with reference to the rated DC voltage. For example, a fault signal can be generated if the measured DC bus voltage does not exceed a certain percentage of the rated DC voltage within a period of time. These parameters can be selected with reference to the level of stored energy in the DC bus.

The supply of the DC voltage is ended when the measured DC bus voltage exceeds the first DC bus voltage, e.g., by opening the contactor in the pre-charge circuit.

After the contactor in the pre-charge circuit is opened, the DC bus voltage will decrease gradually towards the first DC bus voltage.

When the measured DC bus voltage is substantially equal to the first DC bus voltage, the power converter is controlled to provide an expected AC current in at least one of the AC phases of the electrical system. The expected AC current can be selected to be a percentage of the rated converter current, e.g., about 20-30% of the rated converter current. If the expected AC current that is selected is too low, the measurement of the AC current may not be reliable, but the expected AC current should not be selected to be so high that the power converter will be damaged in the case of a failure in one or more of the semiconductor switches during the second diagnostic test. The power converter is optionally also controlled to provide an expected AC voltage in at least one of the AC phases (phase voltage) or between two of the AC phases (line voltage).

The AC current in the at least one of the AC phases of the electrical system is measured by a current sensor. A fault signal is generated if the measured AC current is not within a range defined by the expected AC current plus or minus a tolerance value, e.g., within ±50% of the expected AC current. This tolerance value should be selected to ensure reliable detection of a current sensor fault.

The power converter can be controlled to provide an expected AC current in each of the AC phases of the electrical system. The AC current in each of the AC phases is measured by a respective current sensor and a fault signal is generated if any of the measured AC currents is not within a range defined by the corresponding expected AC current (i.e., the expected AC current for the same AC phase) plus or minus a tolerance value, e.g., within ±50% of the expected AC current.

At least one AC voltage can be measured by a voltage sensor. The at least one AC voltage can be a phase voltage or a line voltage. A fault signal is optionally generated if the measured AC voltage is not within a range defined by the expected AC voltage plus or minus a tolerance value, e.g., within ±20% of the expected AC voltage. This tolerance value should be selected to ensure reliable detection of a voltage sensor fault.

A fault signal can be generated if a measured DC bus voltage falls below an expected DC bus voltage while the power converter is being controlled. In one arrangement, the expected DC bus voltage can be based on a measurement of the DC bus voltage at the start of the power converter control (an "initial DC bus voltage"). For example, a fault signal can be generated if the measured DC bus voltage decreases by a certain percentage, e.g., by about 1.5-2.5%, relative to the initial DC bus voltage. In another arrangement, the expected DC bus voltage can be a threshold, which can optionally be determined with reference to the rated DC voltage. For example, a fault signal can be generated if the measured DC bus voltage falls below a certain percentage of the rated DC voltage. These parameters can be selected to be high enough to manage normal DC bus discharge during the time when the power converter is being controlled.

Outside of the time when the power converter is being controlled, a fault signal can be generated if the AC output current of the power converter exceeds a threshold, e.g., about 2% of the rated converter current. For the protection of the power converter, when the power converter is being controlled, a fault signal can be generated—and the testing process is preferably ended—if the AC output current of the power converter exceeds a maximum threshold, e.g., about 30-35% of the rated converter current.

The semiconductor switches in each converter leg of the power converter can be controlled using a suitable control scheme with a modulation index that generates a sequence of positive and negative current pulses in each of the AC phases. Each current pulse can be applied over two consecutive time periods of the control scheme, with the AC current being measured at the end of the first time period and at the end of the second time period (when the expected AC voltage in each AC phase is typically zero). In one arrangement, where the electrical system has three AC phases, a positive current pulse can be applied to one or more of the AC phases and a negative current pulse can be applied to one or more of the AC phases at the same time. This can be repeated for different combinations of positive and negative current pulses. For example, the modulation index can generate a sequence of different current pulse combinations including:

- a positive current pulse in the first AC phase and a negative current pulse in the second and third AC phases,
- a positive current pulse in the second AC phase and a negative current pulse in the first and third AC phases,
- a positive current pulse in the third AC phase and a negative current pulse in the first and second AC phases,
- a negative current pulse in the first AC phase and a positive current pulse in the second and third AC phases,
- a negative current pulse in the second AC phase and a positive current pulse in the first and third AC phases, and
- a negative current pulse in the third AC phase and a positive current pulse in the first and second AC phases.

It will be readily appreciated that there is no fixed sequence for the current pulse combinations, and it is possible for the control unit to control the power converter to generate some or all of the available current pulse combinations in any suitable sequence or order.

Third Diagnostic Test:

The testing process can include a third diagnostic test comprising the steps of:

measuring a DC bus voltage while a DC voltage is supplied to the DC bus, ending the supply of the DC voltage when the measured DC bus voltage exceeds a second DC bus voltage, and allowing the DC bus voltage to decrease gradually towards the second DC bus voltage, wherein the second DC bus voltage is greater than the first DC bus voltage, when the measured DC bus voltage is substantially equal to the second DC bus voltage, controlling the power converter to provide an expected AC current in at least one AC phase of the electrical system, measuring the AC current in the at least one AC phase of the electrical system, and generating a fault signal if the measured AC current is not within a range defined by the corresponding expected AC current plus or minus a tolerance value.

The third diagnostic test is preferably carried out after the second diagnostic test. However, one or more diagnostic tests may be carried out between the second and third diagnostic tests—see below.

The third diagnostic test corresponds generally to Steps 17-24 of the example testing process described below.

The purpose of the third diagnostic test is to check that the power converter and the sensors are responding as expected. The third diagnostic test is similar to the second diagnostic test but is carried out using a significantly higher DC bus voltage, e.g., at about 90% of the rated DC voltage as opposed to about 10%.

On transition to the third diagnostic test, the DC bus voltage can be below a threshold, which can optionally be determined with reference to the rated DC voltage. For example, the DC bus voltage can be below a certain percentage of the rated DC voltage, e.g., below about 1.5-2.5% of the rated DC voltage. In one arrangement, the DC bus voltage is reduced to below the threshold by operating the optional chopper circuit—see below.

At the start of the third diagnostic test, a DC voltage is supplied to the DC bus to increase the DC bus voltage.

The DC voltage can be supplied by closing the contactor in the pre-charge circuit.

The DC voltage is supplied until a measured DC bus voltage exceeds a second DC bus voltage. The second DC bus voltage can be a threshold which can optionally be determined with reference to the rated DC voltage. For example, the second DC bus voltage can be about 85-95% of the rated DC voltage. The second DC bus voltage should be close to the rated DC voltage to represent normal operation of the electrical system.

A fault signal is generated if a measured DC bus voltage has not exceeded one or more expected DC bus voltages during a respective period of time. In one arrangement, an expected DC bus voltage can be based on a measurement of the DC bus voltage at the start of the third diagnostic test when the pre-charge contactor is closed (an "initial DC bus voltage"). In another arrangement, an expected DC bus voltage can be a threshold, which can optionally be determined with reference to the rated DC voltage. For example, a fault signal can be generated if the measured DC bus voltage has not:

increased by at least about 2-3% during a first period of time (e.g., about 10-30 ms) relative to the initial DC bus voltage, or exceeded a first threshold (e.g., about 5-15% of the rated DC voltage) within a second period of time, e.g., about 0.5-1.5 s, or exceeded a second threshold (e.g., about 85-95% of the rated DC voltage) within a third period of time, e.g., about 5-15 s, where the periods of time are calculated from when the DC voltage is supplied to the DC bus, i.e., when the contactor in the pre-charge circuit is closed. These parameters can be selected with reference to the level of stored energy in the DC bus.

While the DC voltage is being supplied to the DC bus, a DC bus charging time-constant for the DC bus can be determined. For example, first and second DC bus voltages can be measured at different times, and the time-constant can be calculated on the basis that the ratio of the first and second DC bus voltages is equal to $(1-e^{(-t/\tau_{Chg})})$ where $\tau$ is the) time between measurements and $\tau_{Chg}$ is the DC bus charging time-constant. The first DC bus voltage can be measured about 0.5-1.5 s after the DC bus voltage is first supplied to the DC bus and the second DC bus voltage can be measured about 4-6 s later.

The supply of the DC voltage is ended when the measured DC bus voltage exceeds the second DC bus voltage, e.g., by opening the contactor in the pre-charge circuit.

After the contactor in the pre-charge circuit is opened, the DC bus voltage will decrease gradually towards the second DC bus voltage.

If the DC bus includes two or more DC bus capacitors, any imbalance in the partial DC bus voltages can be determined after the contactor in the pre-charge circuit is opened. For example, the partial DC bus voltage across each of the DC bus capacitors can be measured and the difference between the partial DC bus voltages can be calculated. The difference between the partial DC bus voltages can be recorded or stored.

When the measured DC bus voltage is substantially equal to the second DC bus voltage, the power converter is controlled to provide an expected AC current in at least one of the AC phases of the electrical system. The expected AC current can be selected to be a percentage of the rated converter current, e.g., about 20-30% of the rated converter current. If the expected AC current that is selected is too low, the measurement of the AC current may not be reliable, but the expected AC current should not be selected to be so high that the power converter will be damaged in the case of a failure in one or more of the semiconductor switches during the second diagnostic test. The power converter is optionally also controlled to provide an expected AC voltage in at least one of the AC phases (phase voltage) or between two of the AC phases (line voltage).

The AC current in the at least one of the AC phases of the electrical system is measured by a current sensor. A fault signal is generated if the measured AC current is not within a range defined by the expected AC current plus or minus a tolerance value, e.g., within ±50% of the expected AC current. This tolerance value should be selected to ensure reliable detection of a current sensor fault.

The power converter can be controlled to provide an expected AC current in each of the AC phases of the electrical system. The AC current in each of the AC phases is measured by a respective current sensor and a fault signal is generated if any of the measured AC currents is not within a range defined by the corresponding expected AC current (i.e., the expected AC current for the same AC phase) plus or minus a tolerance value, e.g., within ±50% of the expected AC current.

At least one AC voltage can be measured by a voltage sensor. The at least one AC voltage can be a phase voltage or a line voltage. A fault signal is optionally generated if the measured AC voltage is not within a range defined by the expected AC voltage plus or minus a tolerance value, e.g., within ±20% of the expected AC voltage. This tolerance value should be selected to ensure reliable detection of a voltage sensor fault.

A fault signal can be generated if a measured DC bus voltage falls below an expected DC bus voltage while the power converter is being controlled. In one arrangement, the expected DC bus voltage can be based on a measurement of the DC bus voltage at the start of the power converter control (an "initial DC bus voltage"). For example, a fault signal can be generated if the measured DC bus voltage decreases by a certain percentage, e.g., by about 1.5-2.5%, relative to the initial DC bus voltage. In another arrangement, the expected DC bus voltage can be a threshold, which can optionally be determined with reference to the rated DC voltage. For example, a fault signal can be generated if the measured DC bus voltage falls below a certain percentage of the rated DC voltage. These parameters can be selected to be high enough to manage normal DC bus discharge during the time when the power converter is being controlled.

Outside of the time when the power converter is being controlled, a fault signal can be generated if the AC output current of the power converter exceeds a threshold, e.g., about 2% of the rated converter current. For the protection of the power converter, when the power converter is being controlled, a fault signal can be generated—and the testing process is preferably ended—if the AC output current of the power converter exceeds a maximum threshold, e.g., about 30-35% of the rated converter current.

If the DC bus includes two or more DC bus capacitors, the DC bus voltage imbalance can be measured. This can be carried out after the supply of the DC voltage is ended and before the power converter is controlled, for example. Each partial DC bus voltage can be measured and the measurements can be compared to see if the partial DC bus voltages are sufficiently balanced. A positive or negative imbalance can indicate if a particular DC bus capacitor is aging faster than any of the other DC bus capacitors.

A DC bus internal time-constant for the DC bus can be determined. For example, first and second DC bus voltages can be measured at different times, and the time-constant can be calculated on the basis that the ratio of the first and second DC bus voltages is equal to $(1-e^{(-t/\tau_{int})})$ where t is the time between measurements and $\tau_{int}$ is the DC bus internal time-constant. The first DC bus voltage can be measured about when the power converter stops being controlled, and the second DC bus voltage can be measured about 20-40 s later.

The semiconductor switches in each converter leg of the power converter can be controlled using a suitable control scheme with a modulation index that generates a sequence of positive and negative current pulses in each of the AC phases—see the description above for the second diagnostic test. It will be readily understood that the modulation index used during the third diagnostic test will, however, be different because of the higher DC bus voltage.

Fourth Diagnostic Test:

If the electrical system includes an optional chopper circuit, the testing process can include a fourth diagnostic test carried out between the second and third diagnostic steps, i.e., before the DC bus voltage is increased significantly to the second DC bus voltage.

The purpose of the fourth diagnostic test is to check that the optional chopper circuit is responding as expected.

The fourth diagnostic test corresponds generally to Steps 14-16 of the example testing process described below.

The fourth diagnostic test comprises the steps of:
operating the chopper circuit for a period of time to provide an expected DC bus voltage,
after the period of time, measuring the DC bus voltage, and generating a fault signal if the measured DC bus voltage is not within a range defined by the expected DC bus voltage plus or minus a tolerance value, or if the DC bus voltage has not decreased by a certain percentage, relative to an initial DC bus voltage.

In one arrangement, where the DC bus includes two or more series-connected DC bus capacitors, the chopper circuit can be operated to discharge each DC bus capacitor separately with the stored energy being dissipated in the resistor. The testing process can therefore include one or more fourth diagnostic tests, where for each fourth diagnostic test the chopper circuit is operated to discharge a respective DC bus capacitor. For example, if the DC bus includes a first DC bus capacitor connected between the positive and intermediate DC bus terminals, and a second DC bus capacitor connected between the intermediate and negative DC bus terminals, a fourth diagnostic test can be carried out by operating the chopper circuit to create an intermittent short-circuit path between the positive and intermediate DC terminals to discharge the first DC bus capacitor and then measuring the partial DC bus voltage across the first DC bus capacitor, and another fourth diagnostic test can be carried out by operating the chopper circuit to create an intermittent short-circuit path between the negative and intermediate DC terminals to discharge the second DC bus capacitor and then measuring the partial DC bus voltage across the second DC bus capacitor.

The at least one semiconductor switch of the chopper circuit can be switched between an on-state and an off-state according to a suitable control strategy, e.g., a PWM control strategy that uses a modulation index that is selected to result in an expected value of the DC bus voltage. The control unit can control the switching operation of the at least one semiconductor switch (i.e., transition each switch between an on-state and an off-state) by generating gate drive commands for the respective gate drivers based on the control strategy. The modulation index can be calculated based on parameters such as the desired decrease in the DC bus voltage, the total DC bus voltage, the capacitance of the DC bus capacitor, the resistance of the resistor of the chopper circuit, the minimum on-time of the semiconductor switch, the frequency of the carrier waveform etc.

The expected value of the DC bus voltage can be based on a measurement of the DC bus voltage at the start of the fourth diagnostic test (an "initial DC bus voltage"). A fault signal can be generated if the measured DC bus voltage (an "end DC bus voltage") is not within a range defined by the expected DC voltage plus or minus a tolerance value, e.g., within ±1% of the expected DC bus voltage.

A fault signal can be generated if the DC bus voltage has not decreased by a certain percentage, e.g., by about 2-4%, relative to the initial DC bus voltage as a result of operating the chopper circuit for the predetermined period of time.

Fifth Diagnostic Test:

The testing process can include a fifth diagnostic test that is carried out after the third diagnostic test.

The fifth diagnostic test corresponds generally to Steps 25-26 of the example testing process described below.

After the third diagnostic test has been completed, the switching device between the AC terminal(s) of the power converter and the electrical load is preferably opened to electrically isolate the power converter from the electrical load. The response time of the switching device can be checked. In particular, it is possible to measure the time between the open signal being initiated by the control unit and a feedback signal confirming that the switching device has opened. A fault signal is generated if the measured time is greater than an expected response time. The response time of the switching device opening can be recorded or stored.

The fifth diagnostic test comprises the steps of:
operating the chopper circuit to discharge the DC bus capacitor(s) until the DC bus voltage is below a third DC bus voltage, and
generating a fault signal if a measured DC bus voltage has not fallen below an expected DC bus voltage during a period of time.

The purpose of the fifth diagnostic tests is to check that the optional chopper circuit is responding as expected.

During the fifth diagnostic test, the chopper circuit is preferably operated to discharge the DC bus capacitor(s) as rapidly as possible. The third DC bus voltage can be a certain percentage of the rated DC voltage, e.g., about 1.5-2.5% of the rated DC voltage.

In one arrangement, the expected DC bus voltage can be based on a measurement of the DC bus voltage at the start of the fifth diagnostic test when the chopper circuit is operated (an "initial DC bus voltage"). For example, a fault signal can be generated if the measured DC bus voltage does not decrease by a certain percentage relative to the initial DC bus voltage within a period of time. In another arrangement, the expected DC bus voltage can be a threshold, which can optionally be determined with reference to the rated DC voltage. For example, a fault signal can be generated if the measured DC bus voltage does not fall below a certain percentage of the rated DC voltage (e.g., about 3-7% of the rated DC voltage) within a period of time, e.g., about 0.5-1.5 seconds.

A DC bus discharging time-constant for the DC bus can be determined. For example, first and second DC bus voltages can be measured at different times, and the time-constant can be calculated on the basis that the ratio of the first and second DC bus voltages is equal to $(1-e^{(-t/\tau_{Dis})})$ where t is the time between measurements and $\tau_{Dis}$ is the DC bus internal time-constant. The first DC bus voltage can be measured when the DC bus voltage reaches about 50-70% of the rated DC voltage and the second DC bus voltage can be measured when the DC bus voltage reaches about 5-15% of the rated DC voltage.

After the fifth diagnostic test is completed, any cooling system can be turned off. This corresponds generally to Step 27 of the example testing process described below.

DETAILED DESCRIPTION

Figure 1:
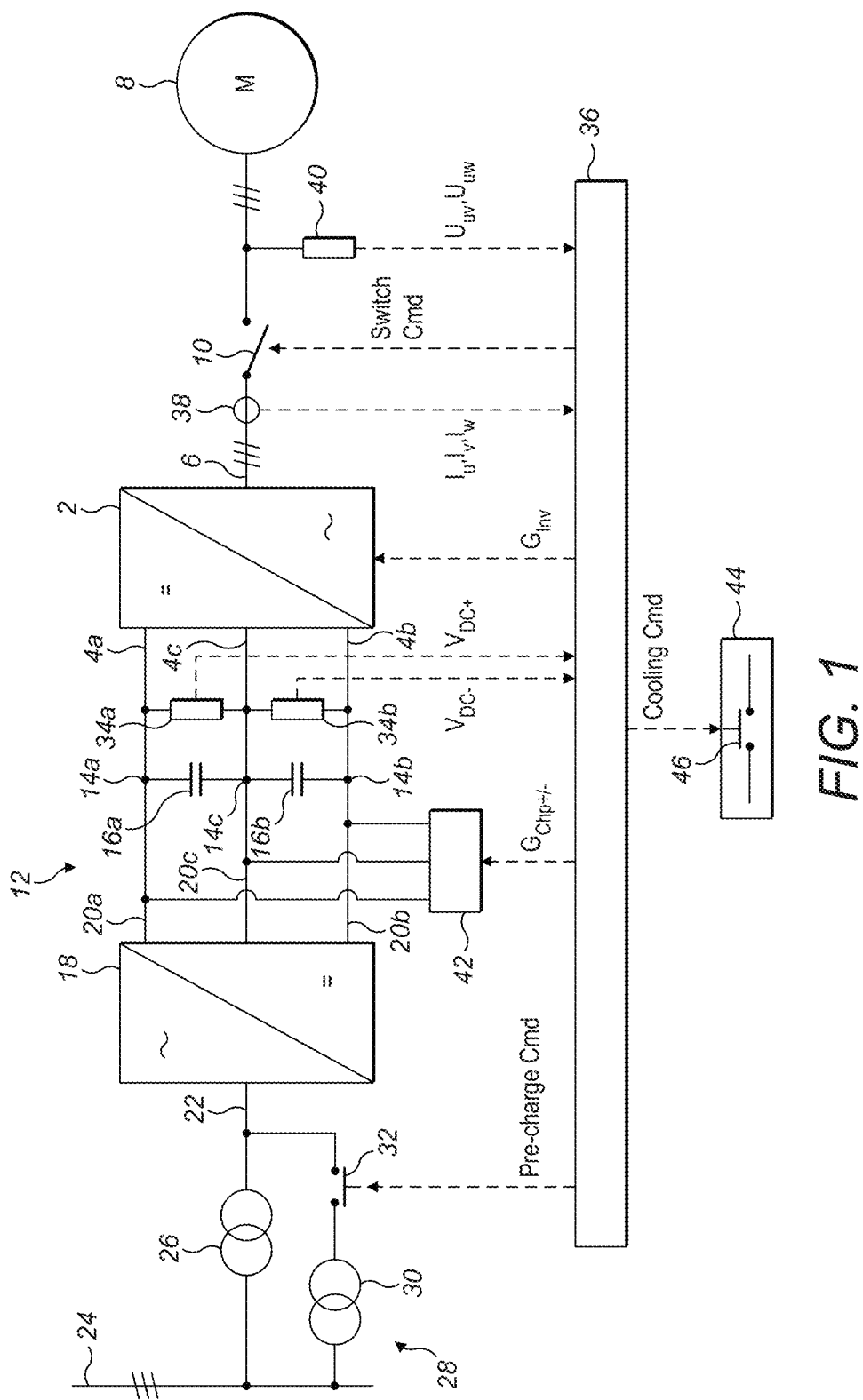
FIG. 1 is a schematic view of an electrical system according to the present invention.

With reference to FIG. 1, an electrical system according to the present invention includes an inverter 2. The inverter 2 includes three direct current (DC) converter terminals 4*a*, 4*b* and 4*c*. Three converter legs (not shown) are connected to the DC converter terminals 4*a*, 4*b* and 4*c*. Each converter leg (not shown) include a plurality of semiconductor switches (e.g., IGBTs) arranged with a suitable topology such as three-level NPP and an alternating current (AC) terminal that defines an AC phase of the electrical system. In the following description, the AC phases are identified by the letters U, V and W, respectively. The inverter 2 therefore includes three AC terminals 6 that are connected to an electric motor 8 by means of a switching device 10.

The DC converter terminals 4a, 4b and 4c are connected to a DC bus 12. The DC bus 12 includes a positive DC bus terminal 14a, a negative DC bus terminal 14b and an intermediate or midpoint DC bus terminal 14c. A first DC bus capacitor 16a is connected between the positive and intermediate DC bus terminals 14a and 14c and a second DC bus capacitor 16b is connected between the negative and intermediate DC bus terminals 14b and 14c.

A diode bridge 18 includes three DC converter terminals 20a, 20b and 20c that are connected to the DC bus 12, and three AC terminals 22.

The AC terminals 22 are connected to an AC power supply 24 by means of a main transformer 26.

A pre-charge circuit 28 is connected between the AC power supply 24 and the AC terminals 22 of the second power converter. The pre-charge circuit 28 includes a pre-charge transformer 30 and a contactor 32. The pre-charge circuit 28 and the diode bridge 18 together define a DC power supply for supplying a DC voltage to the DC bus 12 when the contactor 32 is closed.

A first voltage sensor 34a is connected between the positive and intermediate DC bus terminals 14a and 14c and a second voltage sensor 34b is connected between the negative and intermediate DC bus terminals 14b and 14c. The first voltage sensor 34a is connected to a control unit 36 and measures a positive partial DC bus voltage across the first DC bus capacitor 16a. The second voltage sensor 34b is connected to the control unit 36 and measures a negative partial DC bus voltage across the second DC bus capacitor 16b. The positive partial DC bus voltage is identified below as $V_{DC+}$ and the negative partial DC bus voltage is identified below as $V_{DC-}$. The total DC bus voltage (i.e., the summation of the two partial DC bus voltages) is identified below as $V_{DC}$.

A current sensor 38 is connected to the control unit 36 and measures the AC current in each of the AC phases. The individual AC currents for each of the AC phases are identified below as $I_U$, $I_V$ and $I_W$.

A third voltage sensor 40 is connected to the control unit 36 and measures the AC voltages. In particular, the third voltage sensor 40 measures a first AC line voltage between phases U and V, and a second AC line voltage between phases V and W. The first AC line voltage is identified below as $U_{UV}$ and the second AC line voltage is identified below as $U_{VW}$.

A chopper circuit 42 is connected to the DC bus 12. Although not shown, the chopper circuit 42 includes semiconductor switches (e.g., IGBTs) and a resistor for dissipating excess electrical energy in the DC bus as heat. The chopper circuit is capable of separately discharging the first and second DC bus capacitors 16a and 16b. In other words, the chopper circuit 42 can be operated to discharge just the first DC bus capacitor 16a while the second DC bus capacitor 16b remains charged or vice versa. The chopper circuit 42 can also be operated to discharge the first and second DC bus capacitors 16a and 16b at the same time.

The electrical system also includes a cooling system 44 with a contactor 46.

The control unit 36 can control the pre-charge contactor 32 to open and close. In particular, the control unit 36 can generate a close signal to close the pre-charge contactor 36 so that a DC voltage is supplied to the DC bus 12 through the pre-charge circuit 28 and the diode bridge 18. When the pre-charge contactor 32 has closed, the pre-charge contactor can generate a feedback signal and provide this to the control unit 36. The control unit 36 can generate an open signal to open the pre-charge contactor 36. In FIG. 1, the command signals for the pre-charge contactor 32 are identified by the dashed line labelled "Pre-charge Cmd".

The control unit 36 can also control the cooling system contactor 46 to open and close. In particular, the control unit 36 can generate a close signal to close the cooling system contactor 46 so that one or more pumps are started to circulate coolant, for example. When the cooling system contactor 46 has closed, the cooling system contactor can generate a feedback signal and provide this to the control unit 36. The control unit 36 can generate an open signal to open the cooling system contactor 46. In FIG. 1, the command signals for the cooling system contactor 46 are identified by the dashed line labelled "Cooling Cmd".

The control unit 36 can control the switching device 10 to open and close. In particular, the control unit 36 can generate a close signal to close the switching device 10 so that the AC terminals 6 of the inverter 2 are connected to the electric motor 8. When the switching device 10 has closed, the switching device can generate a feedback signal and provide this to the control unit 36. The control unit 36 can generate an open signal to open the switching device 10 to isolate the inverter 2 from the electric motor 8. When the switching device 10 has opened, the switching device can generate a feedback signal and provide this to the control unit 36. In FIG. 1, the command signals for the switching device 10 are identified by the dashed line labelled "Switch Cmd".

The control unit 36 can generate gate drive commands for controlling the switching operation of the semiconductor devices in each converter leg (not shown) of the inverter 2. The gate drive commands can be generated using a control strategy, e.g., pulse width modulation (PWM) control strategy that uses a modulation index and a carrier waveform. During normal operation of the inverter 2, the control strategy can be used to derive a desired AC current waveform in the AC terminals 6 by transitioning each converter leg (not shown) between different voltage levels. The inverter 2 shown in FIG. 1 has three voltage levels, i.e., a positive voltage level (or +1), a negative voltage level (or −1) and a midpoint (or zero) voltage level (or 0). But it will be readily appreciated that the inverter 2 may have two voltage levels or five or more voltage levels as appropriate. In general terms, if the power converter has n voltage levels, where n=2, 3, 5 etc., the DC bus will have n DC bus terminals and (n−1) DC bus capacitors, each DC bus capacitor being connected between an adjacent pair of DC bus terminals and defining a respective partial DC bus voltage.

Each converter leg (not shown) can be put in an off-state by the control unit.

Each converter leg (not shown) can be put in one of a plurality of on-states by the control unit. As described above, each on-state of the converter leg is determined by the individual switching states of the semiconductor switches, which in turn are determined by the gate drive commands. In one arrangement, where the power converter has three voltage levels, and is being operated as an inverter, a first on-state will define a positive voltage level in the AC phase, a second on-state will define a negative voltage level in the AC phase, and a third on-state will define a zero voltage level in the AC phase, for example.

In FIG. 1, the gate drive commands for the inverter 2 are identified by the dashed line labelled "$G_{Inv}$".

The control unit 36 can generate gate drive commands for controlling the switching operation of the semiconductor devices in the chopper circuit 42. The gate drive commands can be generated using a control strategy, e.g., pulse width modulation (PWM) control strategy that uses a modulation index and a carrier waveform. The gate drive commands can transition the semiconductor switches in the chopper circuit 42 between an on-state and an off-state to create an intermittent short-circuit path between the DC bus terminals 14a and 14c and/or between the DC bus terminals 14b and 14c. The gate drive commands can also maintain the semiconductor switches in the chopper circuit 42 in an on-state to create a continuous short-circuit path. The short-circuit path includes the resistor for dissipating the discharged energy as heat. The resistor is appropriately selected for the particular electrical system.

In FIG. 1, the gate drive commands for the chopper circuit 42 are identified by the dashed line labelled "$G_{Chp+/-}$".

Although FIG. 1 shows a single control unit, it will be readily understood that a plurality of separate, but coordinated, control units can be used.

An example of a fully automated testing process (or "auto-testing process" or "reduced power test") will now be described with reference to FIGS. 2 to 5. The testing process of the electrical system can be initiated by a user or engineer, for example, to validate the hardware components of the electrical system such as the DC link capacitors, the semiconductor switches of the inverter, the current and voltage sensors, and the chopper circuit. The testing process can be used to check the health of the various components—i.e., to determine if the electrical system is operating normally. The testing process allows for any data such as time-constants and current and voltage profiles, for example, to be stored or recorded and/or analysed. Data derived from testing processes carried out a different times can be compared and analysed to determine if any components of the electrical system are responding differently as a result of ageing or internal faults, for example.

Data obtained during the testing process can be displayed to a user or engineer, e.g., on a suitable display panel or monitor. Generated faults can also be displayed.

Figure 2:
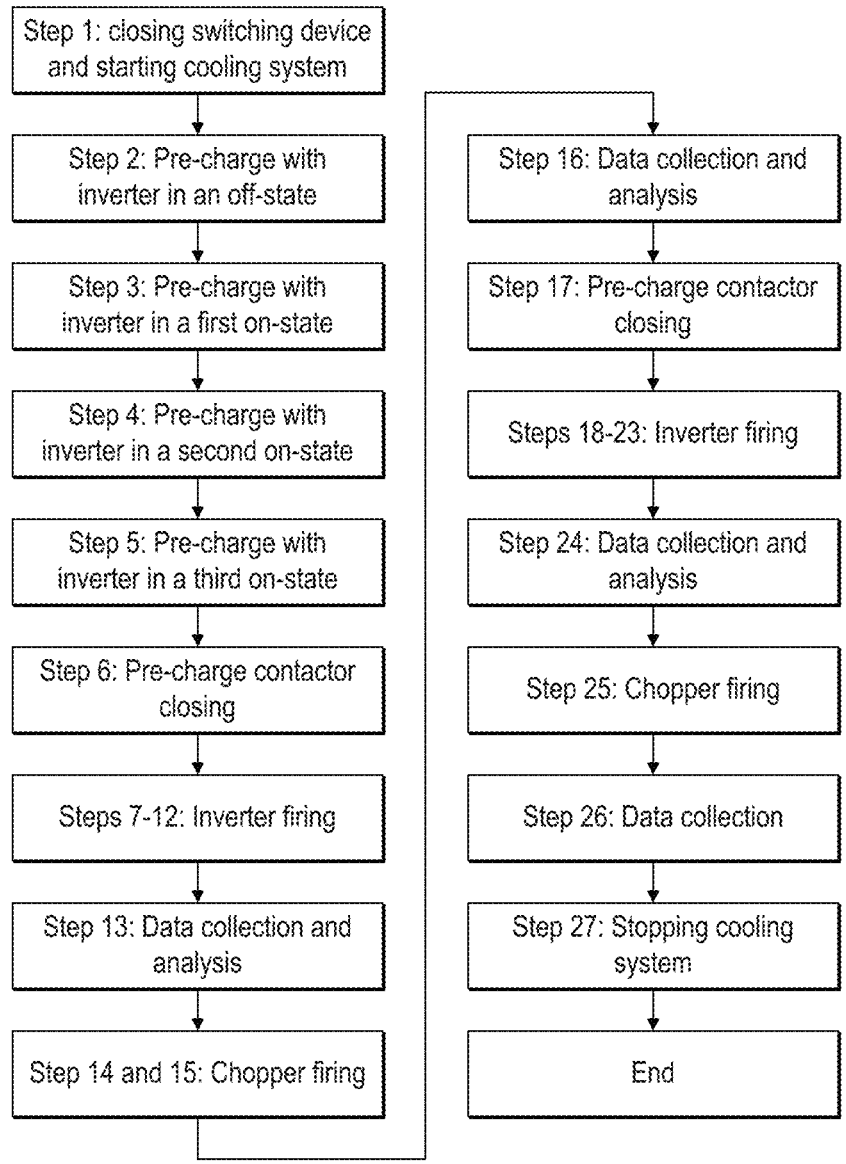
FIG. 2 is a flow diagram showing the individual steps of the testing process according to the present invention.

FIG. 2 is a flow diagram identifying the individual steps (i.e., Steps 1-27) of the testing process.

Figure 3:
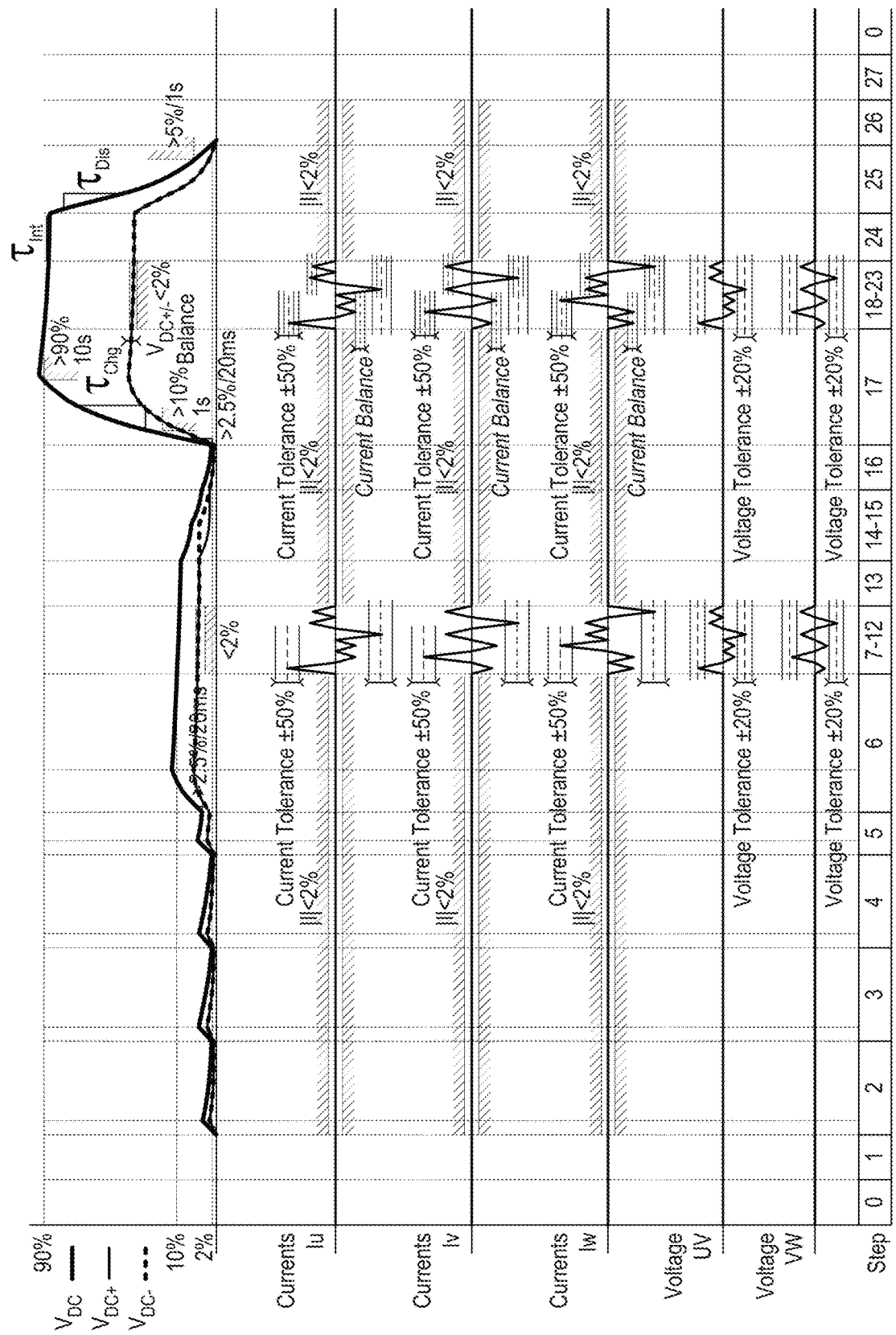
FIG. 3 is diagram showing the various parameters and fault conditions for the individual steps of the testing process.
Figure 3:
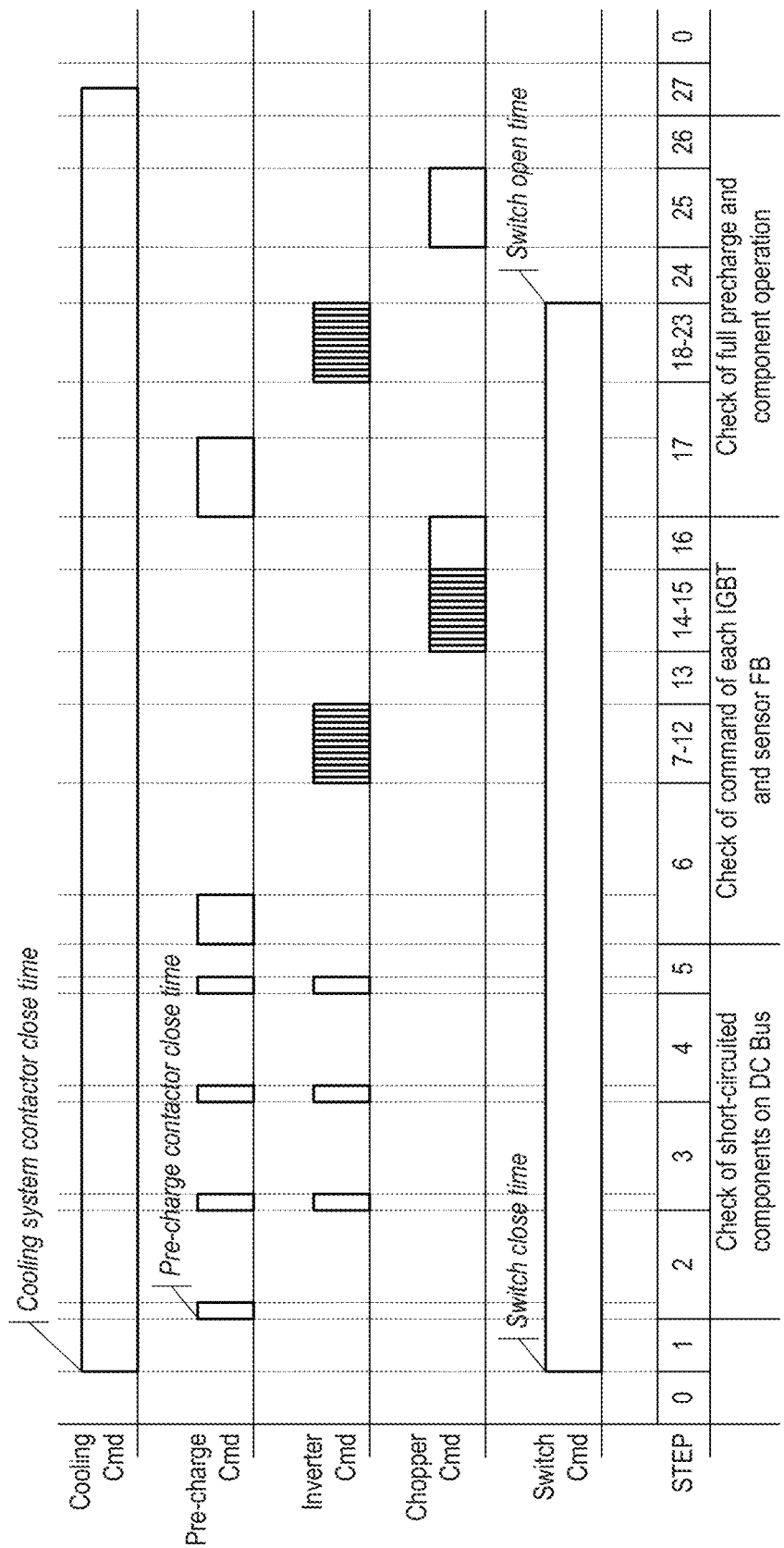

FIG. 3 shows the various parameters and fault conditions for the individual steps of the testing process. In particular FIG. 3 shows, for each of Steps 1-27:
the DC voltage profile with individual profiles for:
the total DC voltage $V_{DC}$,
the positive partial DC voltage profile $V_{DC+}$ and
the negative partial DC voltage profile $V_{DC-}$,
the individual AC current profiles $I_U$, $I_V$ and $I_W$ for phase U, V and W, respectively,
the individual AC voltage profiles $U_{UV}$ and $U_{VW}$,
the command ("Cooling Cmd") for controlling the operation of the cooling system, and in particular for controlling the opening and closing of the cooling system contactor 46—where the cooling system contactor 46 is closed when the command is high and open when the command is low,
the command ("Pre-charge Cmd") for controlling the opening and closing of the pre-charge contactor 32—where the pre-charge contactor 32 is closed when the command is high and open when the command is low,
the command ("Inverter Cmd") for controlling the operation of the inverter 2—where the inverter 2 is controlled when the command is high and in an off-state or not enabled when the command is low,
the command ("Chopper Cmd") for controlling the operation of the chopper circuit 42—where the chopper circuit 42 is controlled to discharge the DC link when the command is high, and
the command ("Switch Cmd") for controlling the opening and closing of the switching device 10—where the switching device 10 is closed when the command is high and open when the command is low.

During the testing process, apart from when the inverter 2 is being controlled in Steps 7-12 and 18-23, a fault signal is generated if the AC output current of the inverter exceeds a threshold, e.g., about 2% of the rated converter current. The testing process can be stopped if a particular fault signal is generated and this is likely to result in the electrical system being damaged Step 1: Closing Switching Device and Starting Cooling System The switching device 10 is closed by the control unit 36 to connect the AC terminals 6 of the inverter 2 to the electric motor 8. The closing response time of the switching device 10 is checked. In particular, the time between the close signal being initiated by the control unit 36 and a feedback signal confirming that the switching device 10 has closed being received is measured. A fault signal is generated if the measured time is greater than an expected response time. The response time for the switching device closing is recorded or stored.

The cooling system 44 is started so that the electrical system is properly cooled while the testing process is carried out. The contactor 46 is closed by the control unit 36. The response time of the contactor 46 is checked. In particular, the time between the close signal being initiated by the control unit 36 and a feedback signal confirming that the contactor 46 has closed being received is measured. A fault signal is generated if the measured time is greater than an expected response time. The response time of the cooling system contactor closing is recorded or stored.

When the switching device 10 is closed and the cooling system 44 is started, the testing process can proceed to Step 2. In the event that that the switching device 10 does not close or the cooling system is not started (e.g., because of a fault) the testing process will normally be stopped.

Step 2: Pre-Charge with Inverter in an Off-State

The inverter 2 is put in an off-state by the control unit 36, i.e., the semiconductor switches in each of the three converter legs are put in an off-state (or turned off).

The pre-charge contactor 32 is closed by the control unit 36 so that a DC voltage is supplied to the DC bus 12 through the pre-charge circuit 28 and the diode bridge 18. The partial DC bus voltages increase as shown in FIG. 3.

The response time of the pre-charge contactor 32 is checked. In particular, the time between the close signal being initiated by the control unit 36 and a feedback signal confirming that the contactor 32 has closed being received is measured. A fault signal is generated if the measured time is greater than an expected response time. The response time of the pre-charge contactor is recorded or stored. The response time of the pre-charge contactor can also be checked in any one of Steps 3-5 described below.

The positive partial DC bus voltage $V_{DC+}$ is measured by the first voltage sensor 34a and the negative partial DC bus voltage $V_{DC-}$ is measured by the second voltage sensor 34b.

A fault signal is generated if one (or both) of the partial DC bus voltages does not exceed an expected partial DC bus voltage. In particular, a fault signal is generated if the measured positive partial DC bus voltage $V_{DC+}$ does not increase by at least about 2.5% relative to an initial positive partial DC bus voltage within about 20 ms of the pre-charge contactor 32 being closed and/or a fault signal is generated if the measured negative partial DC bus voltage $V_{DC-}$ does not increase by at least about 2.5% relative to an initial negative partial DC bus voltage within about 20 ms of the pre-charge contactor being closed.

The initial partial DC bus voltages are measured when the pre-charge contactor 32 is closed.

A fault signal is generated if the AC output current of the inverter 2 exceeds a threshold, e.g., about 2% of the rated converter current.

After a period of time, e.g., about 150 ms, the pre-charge contactor 32 is opened by the control unit so that the supply of DC voltage to the DC bus 12 is stopped.

After the pre-charge contactor 32 is opened, the partial DC bus voltages will decrease gradually as shown in FIG. 3. The testing process can transition to Step 3 when the total DC bus voltage has fallen below a threshold. In particular, the testing process can transition to Step 3 when the measured total DC bus voltage has fallen below about 2% of the rated DC voltage.

A fault signal is generated if the duration of Step 2 exceeds about 180 s.

Step 3: Pre-Charge with Inverter in First On-State

The inverter 2 is put in a first on-state by the control unit 36, i.e., the semiconductor switches in each of the three converter legs are put in an on-state or off-state (turned on or off) as required to put each converter leg in a zero switching state. In the zero switching state, the AC terminal of each converter leg is connected to the intermediate DC bus terminal 14c.

The pre-charge contactor 32 is closed by the control unit 36 so that a DC voltage is supplied to the DC bus 12 through the pre-charge circuit 28 and the diode bridge 18. The partial DC bus voltages increase as shown in FIG. 3.

A fault signal is generated if one (or both) of the partial DC bus voltages does not exceed an expected partial DC bus voltage. In particular, a fault signal is generated if the measured positive partial DC bus voltage $V_{DC+}$ does not increase by at least about 2.5% relative to an initial positive partial DC bus voltage within about 20 ms of the pre-charge contactor 32 being closed and/or the measured negative partial DC bus voltage $V_{DC-}$ does not increase by at least about 2.5% relative to an initial negative partial DC bus voltage within about 20 ms of the pre-charge contactor being closed.

The initial partial DC bus voltages are measured when the pre-charge contactor 32 is closed.

A fault signal is generated if the AC output current of the inverter 2 exceeds a threshold, e.g., about 2% of the rated converter current.

After a period of time, e.g., about 150 ms, the pre-charge contactor 32 is opened by the control unit so that the supply of DC voltage to the DC bus 12 is stopped.

After the pre-charge contactor 32 is opened, the partial DC bus voltages will decrease gradually as shown in FIG. 3. The testing process can transition to Step 4 when the total DC bus voltage has fallen below a threshold. In particular, the testing process can transition to Step 4 when the measured total DC bus voltage has fallen below about 2% of the rated DC voltage.

A fault signal is generated if the duration of Step 3 exceeds about 180 s.

Step 4: Pre-Charge with Inverter in Second On-State

The inverter 2 is put in a second on-state by the control unit 36, i.e., the semiconductor switches in each of the three converter legs are put in an on-state or off-state (turned on or off) as required to put each converter leg in a positive switching state. In the positive switching state, the AC terminal of each converter leg is connected to the positive DC bus terminal 14a.

The pre-charge contactor 32 is closed by the control unit 36 so that a DC voltage is supplied to the DC bus 12 through the pre-charge circuit 28 and the diode bridge 18. The partial DC bus voltages increase as shown in FIG. 3.

A fault signal is generated if one (or both) of the partial DC bus voltages does not exceed an expected partial DC bus voltage. In particular, a fault signal is generated if the measured positive partial DC bus voltage $V_{DC+}$ does not increase by at least about 2.5% relative to an initial positive partial DC bus voltage within about 20 ms of the pre-charge contactor 32 being closed and/or the measured negative partial DC bus voltage $V_{DC-}$ does not increase by at least about 2.5% relative to an initial negative partial DC bus voltage within about 20 ms of the pre-charge contactor 32 being closed.

The initial partial DC bus voltages are measured when the pre-charge contactor 32 is closed.

A fault signal is generated if the AC output current of the inverter 2 exceeds a threshold, e.g., about 2% of the rated converter current.

After a period of time, e.g., about 150 ms, the pre-charge contactor 32 is opened by the control unit so that the supply of DC voltage to the DC bus 12 is stopped.

After the pre-charge contactor 32 is opened, the partial DC bus voltages will decrease gradually as shown in FIG. 3. The testing process can transition to Step 5 when the total DC bus voltage has fallen below a threshold. In particular, the testing process can transition to Step 5 when the measured total DC bus voltage has fallen below about 2% of the rated DC voltage.

A fault signal is generated if the duration of Step 4 exceeds about 180 s.

Step 5: Pre-Charge with Inverter in Third On-State

The inverter 2 is put in a third on-state by the control unit 36, i.e., the semiconductor switches in each of the three converter legs are put in an on-state or off-state (turned on or off) as required to put each converter leg in a negative switching state. In the negative switching state, the AC terminal of each converter leg is connected to the negative DC bus terminal 14b.

The pre-charge contactor 32 is closed by the control unit 36 so that a DC voltage is supplied to the DC bus 12 through the pre-charge circuit 28 and the diode bridge 18. The partial DC bus voltages increase as shown in FIG. 3.

A fault signal is generated if one (or both) of the partial DC bus voltages does not exceed an expected partial DC bus voltage. In particular, a fault signal is generated if the measured positive partial DC bus voltage $V_{DC+}$ does not increase by at least about 2.5% relative to an initial positive DC bus voltage within about 20 ms of the pre-charge contactor 32 being closed and/or the measured negative partial DC bus voltage $V_{DC-}$ does not increase by at least about 2.5% relative to an initial negative DC bus voltage within about 20 ms of the pre-charge contactor being closed.

The initial partial DC bus voltages are measured when the pre-charge contactor 32 is closed.

A fault signal is generated if the AC output current of the inverter 2 exceeds a threshold, e.g., about 2% of the rated converter current.

After a period of time, e.g., about 150 ms, the pre-charge contactor 32 is opened by the control unit so that the supply of DC voltage to the DC bus 12 is stopped.

After the pre-charge contactor 32 is opened, the total DC bus voltage will decrease gradually as shown in FIG. 3. The testing process can transition to Step 6 when the total DC bus voltage has fallen below a threshold or after a period of time.

A fault signal is generated if the duration of Step 5 exceeds about 180 s.

Step 6: Pre-Charge Contactor Closing

The pre-charge contactor 32 is closed by the control unit 36 so that a DC voltage is supplied to the DC bus 12 through the pre-charge circuit 28 and the diode bridge 18. The partial DC bus voltages increase as shown in FIG. 3.

The DC voltage is supplied until the measured total DC bus voltage $V_{DC}$ exceeds a first total DC bus voltage. The first total DC bus voltage is a threshold which is about 10% of the rated DC voltage.

A fault signal is generated if one (or both) of the measured partial DC bus voltages does not exceed an expected partial DC bus voltage during a period of time. The expected partial DC bus voltage is based on a measurement of the partial DC bus voltage at the start of Step 6 when the pre-charge contactor 32 is closed (an "initial partial DC bus voltage"). In particular, a fault signal is generated if the measured positive partial DC bus voltage $V_{DC+}$ does not increase by a certain percentage, e.g., by at least about 2.5%, relative to the initial positive partial DC bus voltage, within a period of time, e.g., about 20 ms and/or the measured negative partial DC bus voltage $V_{DC-}$ does not increase by a certain percentage, e.g., by at least about 2.5%, relative to the initial negative partial DC bus voltage, within a period of time, e.g., about 20 ms.

The pre-charge contactor 32 is opened to end the supply of the DC voltage when the measured total DC bus voltage exceeds the first total DC bus voltage.

After the pre-charge contactor 32 is opened, the total DC bus voltage will decrease gradually towards the first total DC bus voltage as shown in FIG. 3.

A fault signal is generated if the duration of Step 6 exceeds about 20 s.

Steps 7-12: Inverter Firing

When the measured total DC bus voltage $V_{DC}$ is substantially equal to the first total DC bus voltage, the inverter 2 is controlled by the control unit 36 to provide an expected AC current in the AC phases of the electrical system. The expected AC current is selected to be a percentage of the rated converter current, e.g., about 25% of the rated converter current.

While the inverter 2 is being controlled, the AC current in the AC phases of the electrical system is measured by the current sensor 38 and the AC voltages are measured by the voltage sensor 40.

A fault signal is generated if one (or both) of the measured partial DC bus voltages falls below an expected partial DC bus voltage while the inverter 2 is being controlled. The expected partial DC bus voltage is based on a measurement of the partial DC bus voltage at the start of the inverter control (an "initial partial DC bus voltage"). In particular, a fault signal is generated if the measured positive partial DC bus voltage $V_{DC+}$ decreases by a certain percentage, e.g., by about 2%, relative to the initial positive partial DC bus voltage and/or the measured negative partial DC bus voltage $V_{DC-}$ decreases by a certain percentage, e.g., by about 2%, relative to the initial negative partial DC bus voltage. The partial DC bus voltages can be measured at the start of each pulse sequence.

Figure 4:
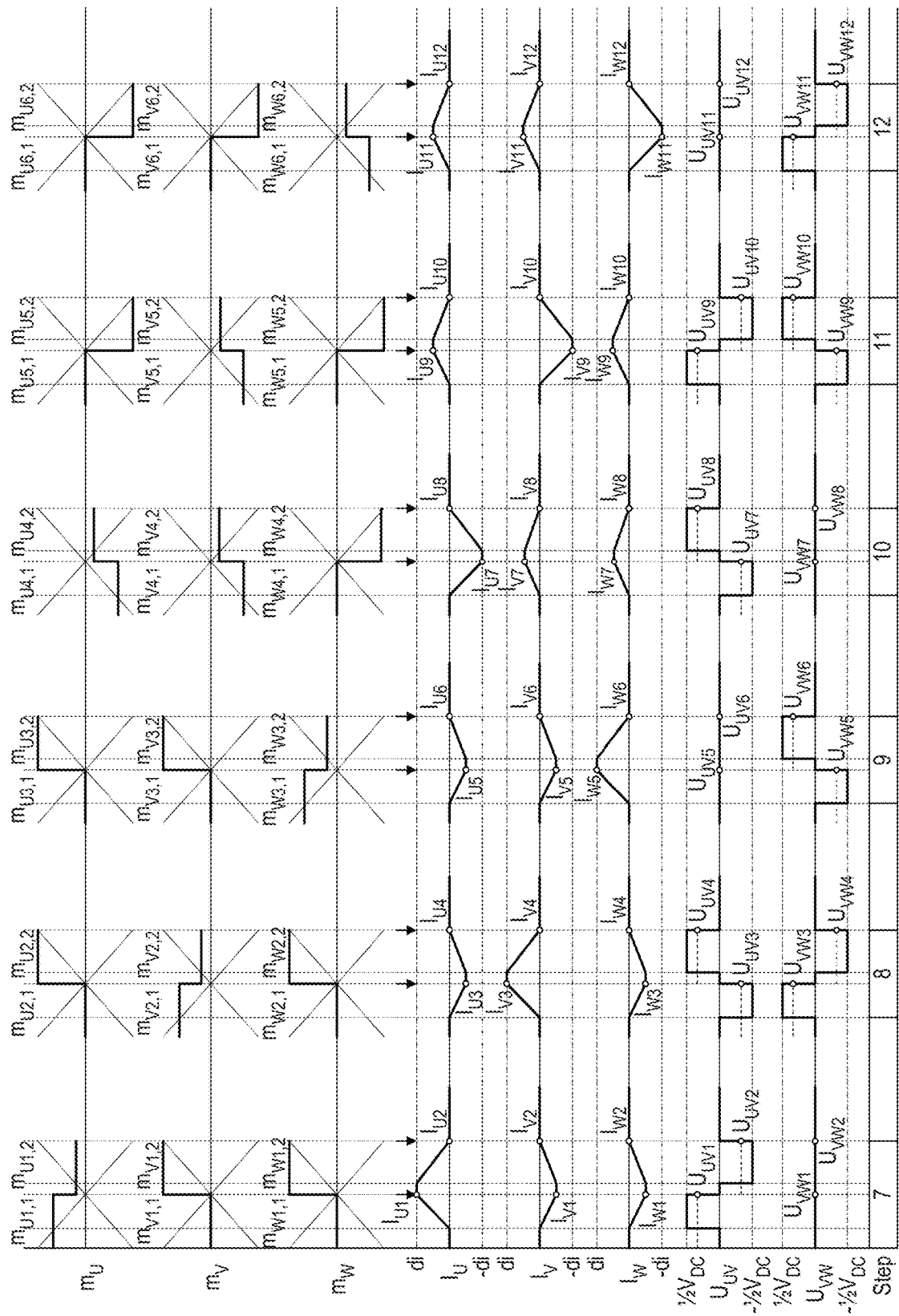
FIG. 4 is a diagram showing a modulation index for controlling the inverter.

The semiconductor switches in each converter leg of the inverter are controlled using a suitable control scheme with a modulation index that generates a sequence of positive and negative current pulses in each of the AC phases. The modulation index is illustrated in FIG. 4. The modulation indices mu, mv and mw are shown for each AC phase (i.e., for controlling the semiconductor switches in each corresponding converter leg). The controller 36 will synchronise the inverter command signal with the positive ramp of the carrier waveform and each current pulse is applied over two consecutive time periods of the control scheme, with the AC current being measured at the end of the first time period and at the end of the second time period (when the expected AC voltage in each AC phase is typically zero).

In FIG. 4, the various measurement times are indicated by solid arrows and the measurements are indicated by the dots labelled $I_{U1}$, $I_{U2}$ ..., $IU_{12}$, $I_{V1}$, $I_{V2}$, ..., $I_{V12}$, $I_{W1}$, $I_{W2}$, ..., $I_{W12}$, $U_{UV1}$, $U_{UV2}$, ..., $U_{UV12}$ and $U_{VW1}$, $U_{VW2}$, ..., $U_{VW12}$. The AC current and voltage measurements from the current and voltage sensors 38, 40 are recorded and analysed in Step 13. AC current measurements are instantaneous and AC voltage measurements are averaged.

In general terms, a positive current pulse can be applied to one or more of the AC phases and a negative current pulse can be applied to one or more of the AC phases at the same time. This can be repeated for different combinations of positive and negative current pulses.

In Step 7, the modulation index generates a positive current pulse in the U phase and negative current pulses in the V and W phases.

In Step 8, the modulation index generates a positive current pulse in the V phase and negative current pulses in the U and W phases.

In Step 9, the modulation index generates a positive current pulse in the W phase and negative current pulses in the U and V phases.

In Step 10, the modulation index generates a negative current pulse in the U phase and positive current pulses in the V and W phases.

In Step 11, the modulation index generates a negative current pulse in the V phase and positive current pulses in the U and W phases.

In Step 12, the modulation index generates a negative current pulse in the W phase and positive current pulses in the U and V phases.

For the protection of the inverter 2, a fault signal is generated—and the testing process is preferably ended—if the AC output current of the inverter 2 exceeds a maximum threshold, e.g., about 33% of the rated converter current during Steps 7-12.

A fault signal is generated if the duration of any of Steps 7-12 exceeds about 0.05 s.

Step 13: Data Collection and Analysis

Measurement data collected during Steps 7-12 is analysed in Step 13.

A fault signal is generated if any of the measured AC currents is not within a range defined by the corresponding expected AC current (i.e., the expected AC current for the same AC phase) plus or minus a tolerance value, e.g., within ±50% of the expected AC current. In particular, for each step, the current is checked at the end of the first time period and at the end of the second time period. As mentioned above, the expected AC current is selected to be about 25% of the rated converter current.

A fault signal is optionally generated if an AC voltage measured by the voltage sensor 40 is not within a range defined by an expected AC voltage plus or minus a tolerance value, e.g., within ±20% of the expected AC voltage.

Once the analysis is complete, the testing process can transition to Step 14.

A fault signal is generated if any measurement data is missing.

A fault signal is generated if the duration of Step 13 exceeds about 0.1 s.

Steps 14 and 15: Chopper Firing

In Step 14 the chopper circuit 42 is operated to discharge the first DC bus capacitor 16a for a period of time and a positive partial DC bus voltage ("$V_{DC+\_End}$") is measured. An initial positive partial DC bus voltage ("$V_{DC+\_Initial}$") is measured when the chopper circuit 42 is first operated. The chopper circuit 42 is operated to create an intermittent short-circuit path between the first and intermediate DC bus terminals 14a and 14c to dissipate stored energy in the first DC bus capacitor 16a in the chopper resistor.

In Step 15 the chopper circuit 42 is operated to discharge the second DC bus capacitor 16b for a period of time and a negative partial DC bus voltage ($V_{DC-\_End}$") is measured. An initial negative partial DC bus voltage ("$V_{DC-\_Initial}$") is measured when the chopper circuit 42 is first operated. The chopper circuit 42 is operated to create an intermittent short-circuit path between the second and intermediate DC bus terminals 14b and 14c to dissipate stored energy in the second DC bus capacitor 16b in the chopper resistor.

In each of Steps 14 and 15, the respective semiconductor switch of the chopper circuit 42 is switched between an on-state and an off-state according to a suitable control strategy, e.g., a PWM control strategy that uses a modulation index that is selected to result in an expected value of the partial DC bus voltage. The modulation index is selected to decrease the respective partial DC bus voltage by about 3%. The modulation index can be calculated based on parameters such as the desired decrease in the partial DC bus voltage, the total DC bus voltage, the capacitance of the DC bus capacitor, the resistance of the resistor of the chopper circuit, the minimum on-time of the semiconductor switch, the frequency of the carrier waveform etc.

Figure 5:
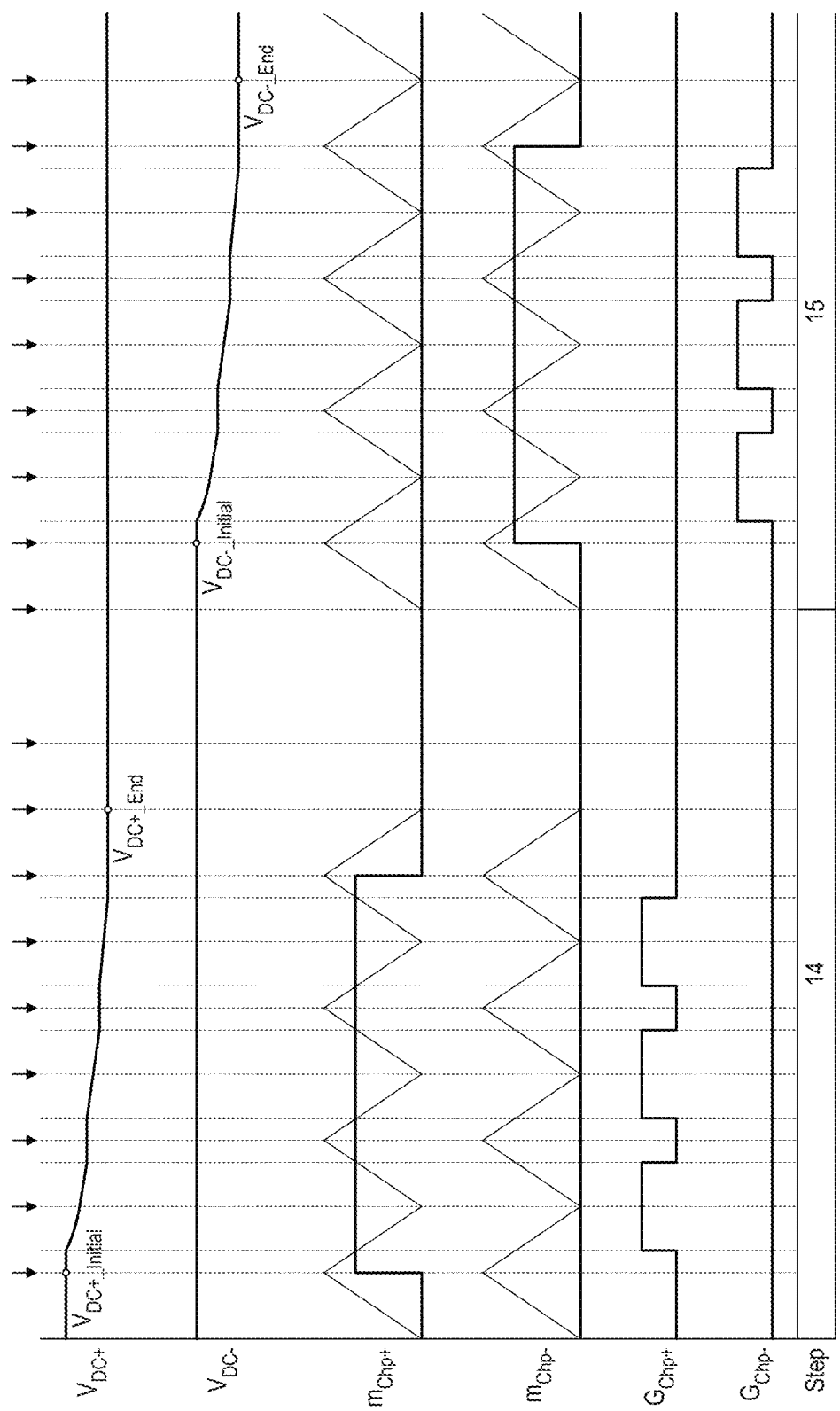
FIG. 5 is a diagram showing a modulation index for controlling the chopper circuit.

The modulation index is illustrated in FIG. 5.

FIG. 5 shows how the positive and negative partial DC voltages $V_{DC+}$ and $V_{DC-}$ decrease during Steps 14 and 15, respectively, as the DC bus capacitors 16a and 16b are discharged. FIG. 5 also shows the modulation indices $m_{Chp+}$ and $m_{Chp-}$ for discharging the first and second DC bus capacitors 16a and 16b and the triangular carrier waveform, and the gate drive commands $G_{Chp+}$ and $G_{Chp-}$ for switching the respective semiconductor switch of the chopper circuit 42 between the on-state and the off-state to provide the expected decrease in the partial DC bus voltages.

A fault signal is generated if the duration of Step 14 exceeds about 0.1 s.

A fault signal is generated if the duration of Step 15 exceeds about 0.1 s.

Step 16: Data Collection

A check is made to ensure that data from Steps 14 and 15 has been collected.

A fault signal is generated if the positive partial DC bus voltage $V_{DC+}$ has not decreased by about 3% relative to the initial measurement of the positive partial DC bus voltage ("$V_{DC+\_Initial}$").

A fault signal is generated if the negative partial DC bus voltage $V_{DC-}$ has not decreased by about 3% relative to the initial measurement of the negative partial DC bus voltage ("$V_{DC-\_Initial}$").

The chopper circuit 42 is operated to discharge the first and second DC bus capacitors 16a and 16b until the total DC bus voltage has fallen below about 2% of the rated DC voltage. The testing process can then transition to Step 17.

A fault signal is generated if the duration of Step 16 exceeds about 1 s.

Step 17: Pre-Charge Contactor Closing

On transition to Step 17, the total DC bus voltage is below a threshold, which is determined with reference to the rated DC voltage. In particular, the total DC bus voltage is below a certain percentage of the rated DC voltage, e.g., below about 2% of the rated DC voltage.

The pre-charge contactor 32 is closed by the control unit 36 so that a DC voltage is supplied to the DC bus 12 through the pre-charge circuit 28 and the diode bridge 18.

The DC voltage is supplied until the measured total DC bus voltage $V_{DC}$ exceeds a second total DC bus voltage. The second total DC bus voltage is a threshold, which is determined with reference to the rated DC voltage. In particular, the second total DC bus voltage is about 90% of the rated DC voltage.

A fault signal is generated if the one (or both) of the measured partial DC bus voltages does not exceed one or more expected partial DC bus voltages during a respective period of time. In particular, a fault signal is generated if:

the measured positive partial DC bus voltage $V_{DC+}$ has not:
increased by at least about 2.5% during a first period of time (e.g., about 20 ms) relative to an initial positive partial DC bus voltage measured when the pre-charge contactor 32 is closed at the start of Step 17, or
exceeded a first threshold (e.g., about 10% of the rated DC voltage) within a second period of time, e.g., about 1.0 s, or
exceeded a second threshold (e.g., about 90% of the rated DC voltage) within a third period of time, e.g., about 10 s, where the periods of time are calculated from when the DC voltage is supplied to the DC bus, i.e., when the pre-charge contactor 32 is closed, and/or the measured negative partial DC bus voltage $V_{DC-}$ has not:
increased by at least about 2.5% during a first period of time (e.g., about 20 ms) relative to an initial negative partial DC bus voltage measured when the pre-charge contactor 32 is closed at the start of Step 17, or
exceeded a first threshold (e.g., about 10% of the rated DC voltage) within a second period of time, e.g., about 1.0 s, or
exceeded a second threshold (e.g., about 90% of the rated DC voltage) within a third period of time, e.g., about 10 s, where the periods of time are calculated from when the DC voltage is supplied to the DC bus, i.e., when the pre-charge contactor 32 is closed.

While the DC voltage is being supplied to the DC bus, a DC bus charging time-constant for the DC bus is determined. A first DC bus voltage is measured about is after the pre-charge charge contactor 32 is closed and a second DC bus voltage is measured about 5 s later. The time-constant is calculated on the basis that the ratio of the first and second DC bus voltages is equal to $(1-e^{(-t/\tau Chg)})$ where t is the time between measurements and $\tau_{Chg}$ is the DC) bus charging time-constant. The DC bus charging time-constant is recorded or stored.

The pre-charge contactor 32 is opened to end the supply of the DC voltage when the measured total DC bus voltage exceeds the second total DC bus voltage.

After the pre-charge contactor 32 is opened, the total DC bus voltage will decrease gradually towards the second total DC bus voltage.

Any imbalance in the partial DC bus voltages is determined after the pre-charge contactor 32 is opened. In particular, the partial positive and negative DC bus voltages $V_{DC+}$ and $V_{DC-}$ across the first and second DC bus capacitors 16a, 16b can be measured and the difference between them is calculated. The difference between the partial DC bus voltages is recorded or stored. A positive or negative imbalance can indicate if one of the DC bus capacitors is aging faster than the other DC bus capacitor.

A fault signal is generated if the duration of Step 17 exceeds about 20 s.

Steps 18-23: Inverter Firing

When the measured total DC bus voltage $V_{DC}$ is substantially equal to the second total DC bus voltage, i.e., about 90% of the rated DC voltage, the inverter 2 is controlled by the control unit 36 to provide an expected AC current in the AC phases of the electrical system. The expected AC current is selected to be a percentage of the rated converter current, e.g., about 25% of the rated converter current.

While the inverter 2 is being controlled, the AC current in the AC phases of the electrical system is measured by the current sensor 38.

A fault signal is generated if one (or both) of the measured partial DC bus voltages falls below an expected partial DC bus voltage while the inverter 2 is being controlled. The expected partial DC bus voltage is based on a measurement of the partial DC bus voltage at the start of the inverter control (an "initial partial DC bus voltage"). In particular, a fault signal is generated if the measured positive partial DC bus voltage $V_{DC+}$ decreases by a certain percentage, e.g., by about 2%, relative to the initial positive partial DC bus voltage and/or the measured negative partial DC bus voltage $V_{DC-}$ decreases by a certain percentage, e.g., by about 2%, relative to the initial negative partial DC bus voltage.

The semiconductor switches in each converter leg of the inverter are controlled using a suitable control scheme with a modulation index that generates a sequence of positive and negative current pulses in each of the AC phases. This modulation index is the similar as that described above with reference to FIG. 4, but will take into account the significantly higher DC bus voltage.

In general terms, a positive current pulse can be applied to one or more of the AC phases and a negative current pulse can be applied to one or more of the AC phases at the same time. This can be repeated for different combinations of positive and negative current pulses.

In Step 18, the modulation index generates a positive current pulse in the U phase and negative current pulses in the V and W phases.

In Step 19, the modulation index generates a positive current pulse in the V phase and negative current pulses in the U and W phases.

In Step 20, the modulation index generates a positive current pulse in the W phase and negative current pulses in the U and V phases.

In Step 21, the modulation index generates a negative current pulse in the U phase and positive current pulses in the V and W phases.

In Step 22, the modulation index generates a negative current pulse in the V phase and positive current pulses in the U and W phases.

In Step 23, the modulation index generates a negative current pulse in the W phase and positive current pulses in the U and V phases.

For the protection of the inverter 2, a fault signal is generated—and the testing process is preferably ended—if the AC output current of the inverter 2 exceeds a maximum threshold, e.g., about 33% of the rated converter current during Steps 17-22.

A fault signal is generated if the duration of any of Steps 18-23 exceeds about 0.05 s.

Step 24: Data Collection and Analysis

Measurement data collected during Steps 18-23 is analysed in Step 24.

A fault signal is generated if any of the measured AC currents is not within a range defined by the corresponding expected AC current (i.e., the expected AC current for the same AC phase) plus or minus a tolerance value, e.g., within ±50% of the expected AC current. In particular, for each step, the current is checked at the end of the first time period and at the end of the second time period. As mentioned above, the expected AC current is selected to be about 25% of the rated converter current.

A fault signal is optionally generated if an AC voltage measured by the voltage sensor 40 is not within a range defined by an expected AC voltage plus or minus a tolerance value, e.g., within ±20% of the expected AC voltage.

A DC bus internal time-constant for the DC bus is determined. For example, first and second DC bus voltages can be measured at different times, and the time-constant is calculated on the basis that the ratio of the first and second DC bus voltages is equal to $(1-e^{(-t/\tau_{Int})})$ where t is the time between measurements and $T_{Int}$ is the DC bus internal time-constant. The first DC bus voltage is measured about when the power converter stops being controlled, and the second DC bus voltage is measured about 30 s later. The DC bus internal time-constant is recorded or stored.

At the start of Step 24, the switching device 10 is opened to isolate the inverter 2 from the electric motor 8. The switching device 10 is opened by the control unit 36. The opening response time of the switching device 10 is checked. In particular, the time between the open signal being initiated by the control unit 36 and a feedback signal confirming that the switching device 10 has opened being received is measured. A fault signal is generated if the measured time is greater than an expected response time. The response time for the switching device opening is recorded or stored.

A fault signal is generated if any measurement data is missing.

A fault signal is generated if the duration of Step 24 exceeds about 35 s.

Step 25: Chopper Firing

The chopper circuit 42 is operated to discharge the first and second DC bus capacitors 16a, 16b as rapidly as possible until the total DC bus voltage is below a third total DC bus voltage, e.g., about 2% of the rated DC voltage. The chopper circuit 42 is operated to create a continuous short-circuit path (i.e., with a modulation index equal to 1) between the first and intermediate DC bus terminals 14a and 14c, and between the second and intermediate DC bus terminals 14b and 14c.

A fault signal is generated if a measured total DC bus voltage has not fallen below an expected total DC bus voltage during a period of time. In particular, a fault signal is generated if the measured total DC bus voltage has fallen below a certain percentage of the rated DC voltage (e.g., about 5% of the rated DC voltage) within a period of time, e.g., about 1.0 seconds.

A DC bus discharging time-constant for the DC bus is determined. The first DC bus voltage is measured when the DC bus voltage reaches about 60% of the rated DC voltage and the second DC bus voltage is measured when the DC bus voltage reaches about 10% of the rated DC voltage. The time-constant is calculated on the basis that the ratio of the first and second DC bus voltages is equal to $(1-e^{(-t/\tau_{Dis})})$ where t is the time between measurements and $\tau_{Dis}$ is the DC bus internal time-constant. The DC bus discharging time-constant is recorded or stored.

A fault signal is generated if the duration of Step 24 exceeds about 2 s.

Step 26: Data Collection

A check is made to ensure that data from Step 25 has been collected.

The testing process can then transition to Step 27.

A fault signal is generated if the duration of Step 26 exceeds about 0.5 s.

Step 27: Stopping Cooling System

In Step 27 the cooling system is stopped by opening the cooling system contactor 46.

A fault signal is generated if the duration of Step 27 exceeds about 70 s.

I claim:

1. A testing process for an electrical system, the electrical system comprising:
   a power converter including:
      two or more direct current (DC) converter terminals, and
      at least one converter leg connected to the DC converter terminals, each converter leg including a plurality of semiconductor switches and an alternating current AC terminal that defines an AC phase of the electrical system and is connectable to a respective AC terminal of an electrical load,
      wherein the plurality of semiconductor switches are controllable to put the converter leg in an off-state, or in one of a plurality of on-states that defines a respective voltage level of the converter leg;
   a DC bus including:
      two or more DC bus terminals, each DC bus terminal being connected to a respective DC converter terminal, and
      at least one DC bus capacitor; and
   a pre-charge circuit with a contactor;
   the testing process being a fully automated testing process, comprising,
   conducting a sequence of different diagnostic tests on the electrical system, each diagnostic test testing one of the power converter and the DC bus to determine if it is responding as expected or operating within normal parameters; and
   conducting one or more first diagnostic tests where each converter leg is in the off-state, or in the same one of the plurality of on-states, each first diagnostic test comprising:
      closing the pre-charge contactor for a period of time to supply the DC voltage to the DC bus,
      checking the response time of the pre-charge contactor by measuring the time between a close signal being initiated and a feedback signal confirming the pre-charge contactor has closed being received,
      generating a fault signal if the measured time is greater than an expected response time; and
      measuring a DC bus voltage while a DC voltage is supplied to the DC bus for a period of time, and generating a fault signal if the measured DC bus voltage does not exceed a first expected DC bus voltage.

2. The testing process of claim 1, wherein a plurality of first diagnostic tests are carried out sequentially with the converter legs in a different state for each first diagnostic test.

3. The testing process of claim 1, further comprising:
   a second diagnostic test comprising the steps of:
      measuring a DC bus voltage while a DC voltage is supplied to the DC bus,
      ending the supply of the DC voltage when the measured DC bus voltage exceeds a first DC bus voltage, and allowing the DC bus voltage to decrease gradually towards the first DC bus voltage,
      when the measured DC bus voltage is substantially equal to the first DC bus voltage, controlling the power converter to provide an expected AC current in at least one AC phase of the electrical system,
      measuring the AC current in the at least one AC phase of the electrical system, and
      generating a fault signal if the measured AC current is not within a range defined by the corresponding expected AC current plus or minus a tolerance value.

4. The testing process of claim 3, wherein the second diagnostic test further comprises:
   controlling the power converter to provide an expected AC voltage in at least one of the AC phases or between two of the AC phases,
   measuring the AC voltage in a least one of the AC phases or between two of the AC phases, and
   generating a fault signal if the measured AC voltage is not within a range defined by the corresponding expected AC voltage plus or minus a tolerance value.

5. The testing process of claim 3, wherein the second diagnostic test further comprises generating a fault signal if a measured DC bus voltage falls below an expected DC bus voltage while the power converter is being controlled.

6. The testing process of claim 3, wherein the second diagnostic test further comprises controlling the power converter using a control scheme with a selected modulation index.

7. The testing process of claim 3, further comprising:
   a third diagnostic test comprising the steps of:
      measuring a DC bus voltage while a DC voltage is supplied to the DC bus,
      ending the supply of the DC voltage when the measured DC bus voltage exceeds a second DC bus voltage, and allowing the DC bus voltage to decrease gradually towards the second DC bus voltage, wherein the second DC bus voltage is greater than the first DC bus voltage,
      when the measured DC bus voltage is substantially equal to the second DC bus voltage, controlling the power converter to provide an expected AC current in at least one AC phase of the electrical system,
      measuring the AC current in the at least one AC phase of the electrical system, and
      generating a fault signal if the measured AC current is not within a range defined by the corresponding expected AC current plus or minus a tolerance value.

8. The testing process of claim 1, wherein the electrical system further comprises a chopper circuit connected to the DC bus, and wherein the testing process further comprises:
- a fourth diagnostic test comprising the steps of:
  - operating the chopper circuit for a period of time to provide an expected DC bus voltage,
  - after the period of time, measuring the DC bus voltage, and
  - generating a fault signal if the measured DC bus voltage is not within a range defined by the expected DC bus voltage plus or minus a tolerance value, or if the DC bus voltage has not decreased by a certain percentage, relative to an initial DC bus voltage.

9. The testing process of claim 8, wherein the fourth diagnostic test comprises operating the chopper circuit using a control scheme with a selected modulation index.

10. The testing process of claim 8, further comprising a fifth diagnostic test comprising the steps of:
- operating the chopper circuit to discharge the DC bus capacitor(s) until the DC bus voltage is below a third DC bus voltage, and
- generating a fault signal if a measured DC bus voltage has not fallen below an expected DC bus voltage during a period of time.

11. The testing process of claim 1, wherein the electrical system further includes a switching device, and each AC phase of the electrical system is connectable to the respective AC terminal of the electrical load by means of the switching device, and wherein the testing process further comprises:
- a zeroth diagnostic test carried out before any of the other diagnostic tests, the zeroth diagnostic test comprising the steps of:
  - closing the switching device to connect the power converter to the electrical load,
  - checking the response time of the switching device by measuring the time between a close signal being initiated and a feedback signal confirming the switching device has closed being received, and
  - generating a fault signal if the measured time is greater than an expected response time.

12. The testing process of claim 11, wherein the electrical system further comprises a cooling system including a contactor, and the zeroth diagnostic test further comprises the steps of:
- closing the cooling system contactor,
- checking the response time of the cooling system contactor by measuring the time between a close signal being initiated and a feedback signal confirming the cooling system contactor has closed being received, and
- generating a fault signal if the measured time is greater than an expected response time.

13. An electrical system comprising:
- a power converter including:
  - two or more DC converter terminals, and
  - at least one converter leg connected to the DC converter terminals, each converter leg including a plurality of semiconductor switches and an AC terminal that defines an AC phase of the electrical system and is connectable to a respective AC terminal of an electrical load;
- a DC bus including:
  - two or more DC bus terminals, each DC bus terminal being connected to a respective DC converter terminal, and
  - at least one DC bus capacitor;
- a DC voltage supply for supplying a DC voltage to the DC bus;
- a control unit adapted to control the DC voltage supply and the plurality of semiconductor switches to put the converter leg in an off-state, or in one of a plurality of on-states that defines a respective voltage level of the converter leg;
- at least one voltage sensor connected to the control unit for measuring a DC bus voltage;
- a pre-charge circuit with a contactor; and
- at least one current sensor connected to the control unit for measuring an AC current in least one AC phase of the electrical system;
- wherein the control unit is further adapted to carry out a testing process being a fully automated testing process where a sequence of different diagnostic tests are carried out on the electrical system, each diagnostic test testing one of the power converter and the DC bus to determine if it is responding as expected or operating within normal parameters.

14. The electrical system of claim 13, further comprising a chopper circuit connected to the DC bus.

15. The electrical system of claim 13, further comprising a switching device, and each AC phase of the electrical system is connectable to the respective AC terminal of the electrical load by means of the switching device.

16. The electrical system of claim 13, further comprising a cooling system including a contactor.

* * * * *